United States Patent
Kinjo

(10) Patent No.: US 11,656,134 B2
(45) Date of Patent: May 23, 2023

(54) PRESSING FORCE SENSOR WITH IMPROVED DYNAMIC RANGE INCREASE

(71) Applicant: Japan Display Inc., Tokyo (JP)

(72) Inventor: Hiroumi Kinjo, Tokyo (JP)

(73) Assignee: Japan Display Inc., Tokyo (JP)

( * ) Notice: Subject to any disclaimer, the term of this patent is extended or adjusted under 35 U.S.C. 154(b) by 236 days.

(21) Appl. No.: 17/124,835

(22) Filed: Dec. 17, 2020

(65) Prior Publication Data

US 2021/0190607 A1    Jun. 24, 2021

(30) Foreign Application Priority Data

Dec. 24, 2019    (JP) .............................. JP2019-232894

(51) Int. Cl.
*G01L 1/20*    (2006.01)
*G01L 1/22*    (2006.01)
*H01L 29/84*   (2006.01)

(52) U.S. Cl.
CPC ............ *G01L 1/205* (2013.01); *G01L 1/2293* (2013.01); *H01L 29/84* (2013.01)

(58) Field of Classification Search
None
See application file for complete search history.

(56) References Cited

U.S. PATENT DOCUMENTS

| 2017/0262112 A1* | 9/2017 | Noguchi | ............. G02F 1/13338 |
| 2018/0269262 A1* | 9/2018 | Ito | ......................... G06F 3/0446 |
| 2019/0219462 A1* | 7/2019 | Nada | ....................... G01L 1/205 |

FOREIGN PATENT DOCUMENTS

| JP | 2016-004940 A | 1/2016 |
| JP | 2018-044937 A | 3/2018 |

* cited by examiner

*Primary Examiner* — Brandi N Hopkins
*Assistant Examiner* — Nigel H Plumb
(74) *Attorney, Agent, or Firm* — Maier & Maier, PLLC

(57) ABSTRACT

A pressing force sensor includes a sensor area, individual electrodes arranged in a matrix in a first direction and a second direction crossing the first direction in the sensor area, a common electrode opposed to the individual electrodes, first spacers arranged between the individual electrodes and the common electrode and overlapping the individual electrodes, and second spacers disposed in the sensor area and formed of a different material from the first spacers. With that arrangement, the dynamic range of the pressing force sensor is increased.

20 Claims, 21 Drawing Sheets

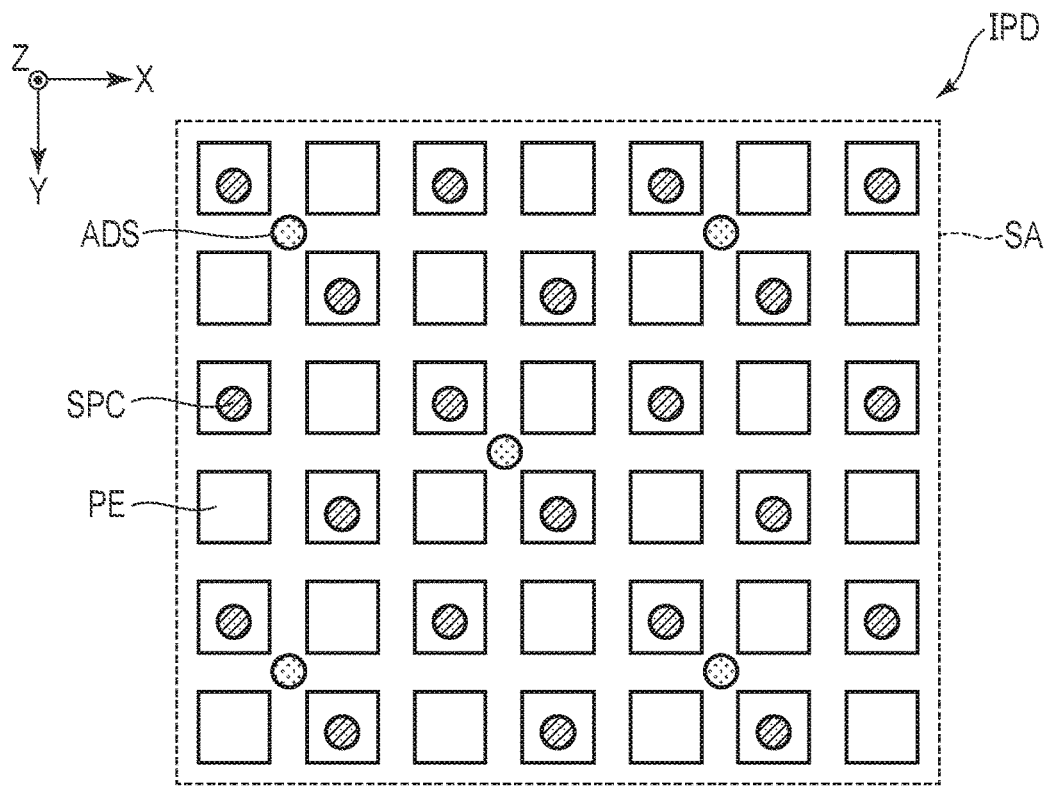
F I G. 14A
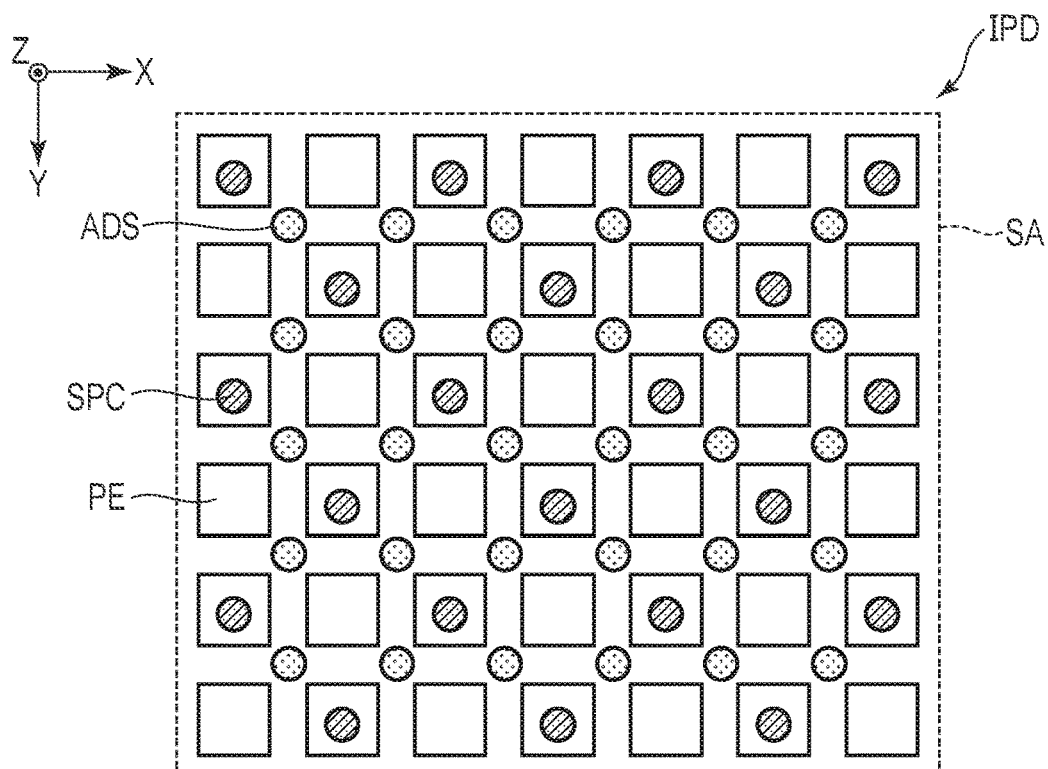
F I G. 14B

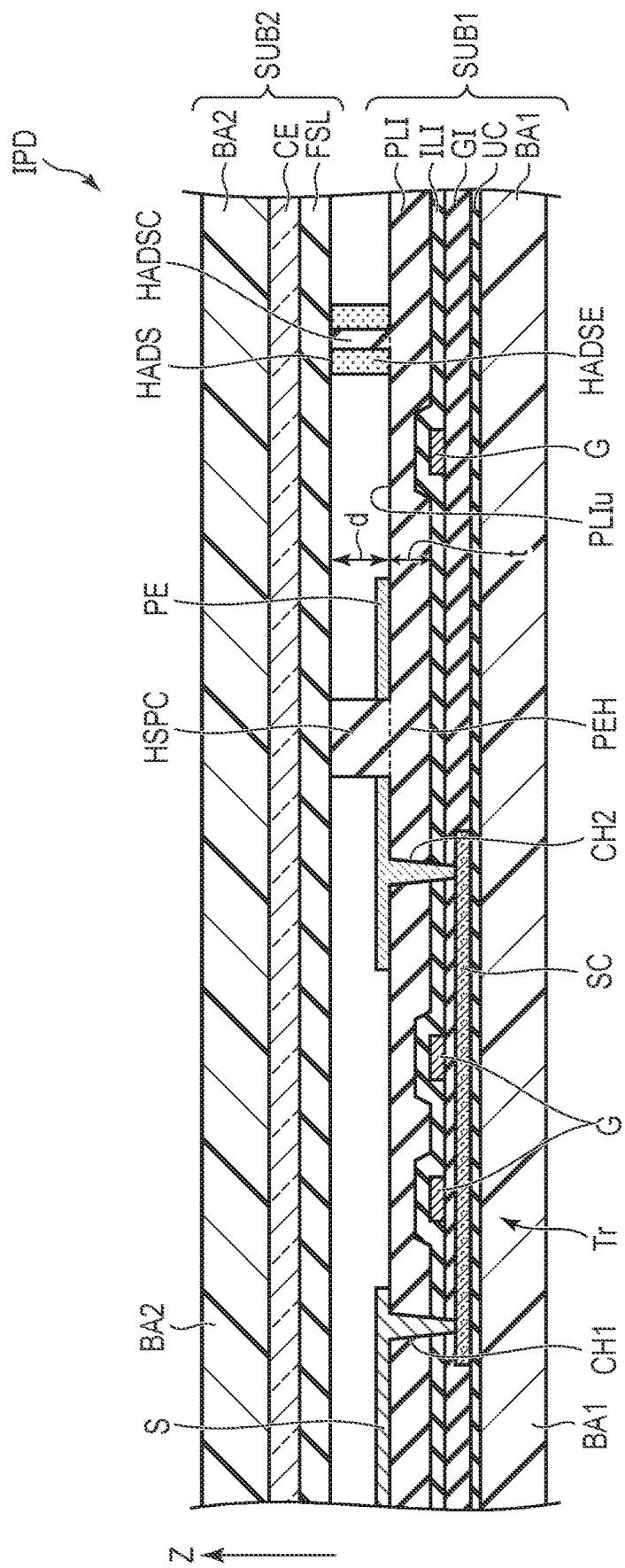
F I G. 17

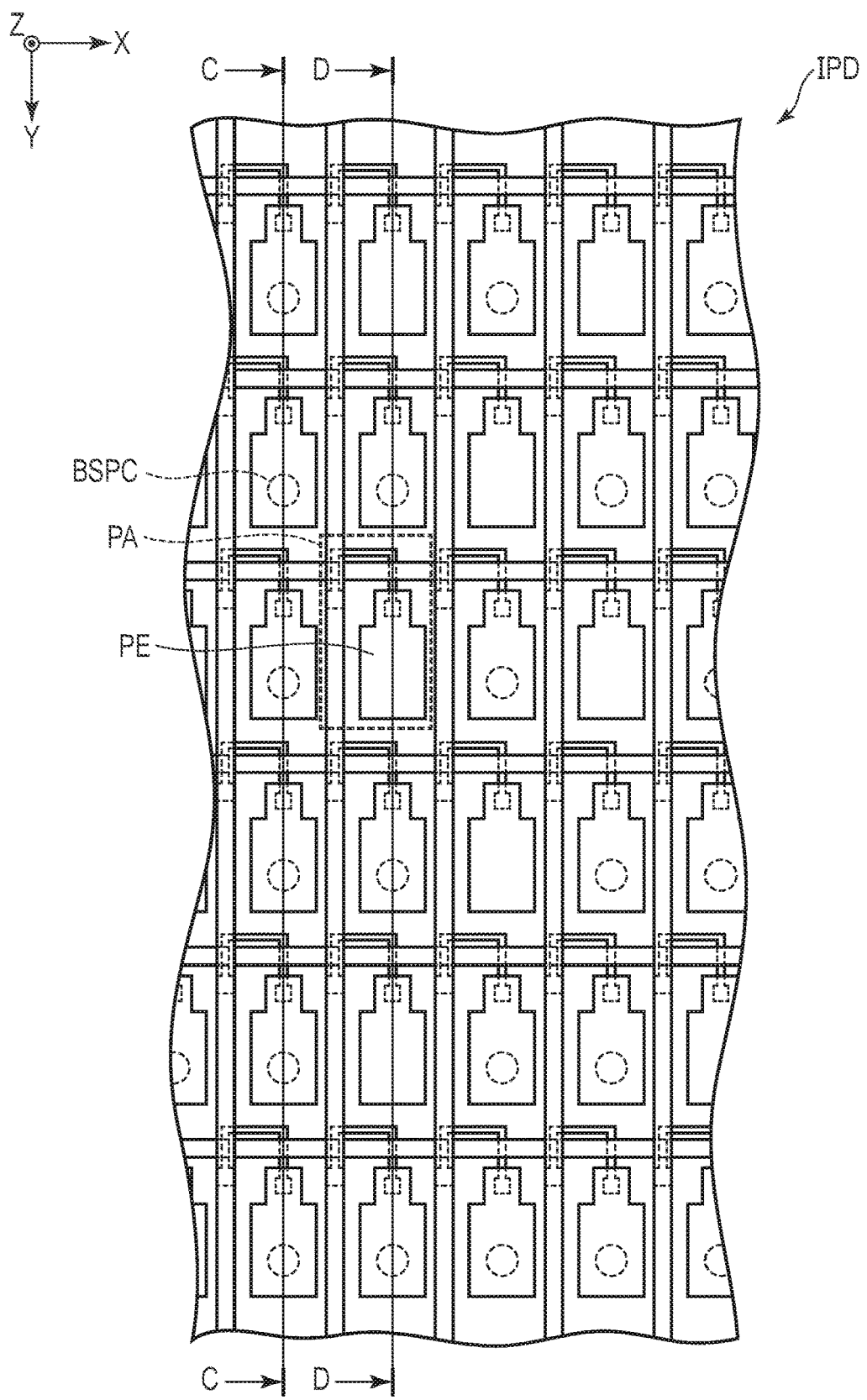
F I G. 20

PRESSING FORCE SENSOR WITH IMPROVED DYNAMIC RANGE INCREASE

CROSS-REFERENCE TO RELATED APPLICATIONS

This application is based upon and claims the benefit of priority from Japanese Patent Application No. 2019-232894, filed Dec. 24, 2019, the entire contents of which are incorporated herein by reference.

FIELD

Embodiments described herein relate generally to a pressing force sensor.

BACKGROUND

A pressure sensor in which a large number of thin-film transistors are combined with a pressure-sensitive resin is known.

BRIEF DESCRIPTION OF THE DRAWINGS

FIG. 14A is a plan view showing another configuration example of the pressing force sensor.

FIG. 14B is a plan view showing another configuration example of the pressing force sensor.

FIG. 17 is a cross-sectional view showing another configuration example of the pressing force sensor in the present embodiment.

FIG. 20 is a plan view showing another configuration example of the pressing force sensor.

DETAILED DESCRIPTION

Figures 1A, 1B:
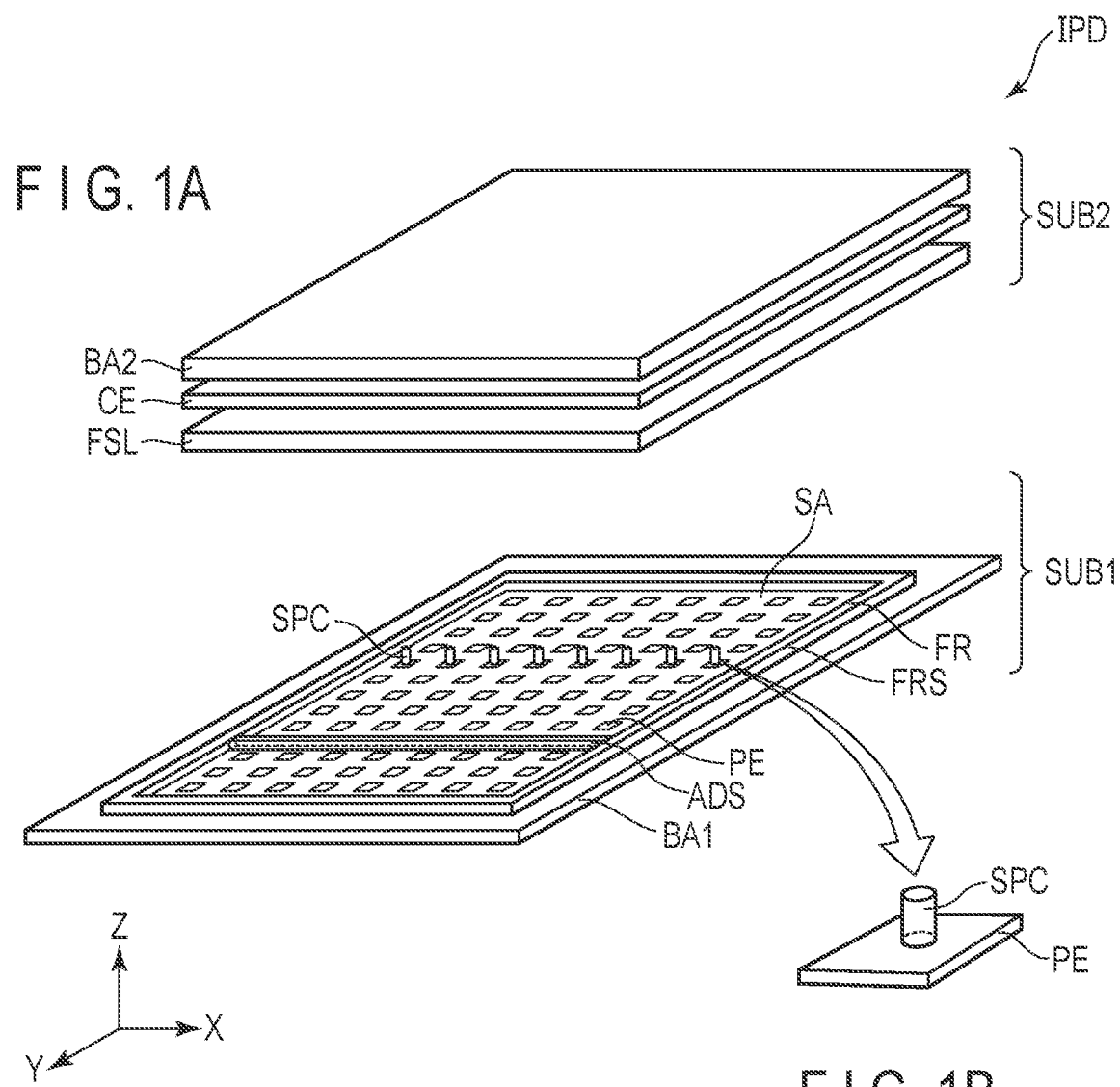
FIG. 1A is an exploded perspective view of a pressing force sensor IPD of Embodiment 1.
FIG. 1B is an enlarged perspective view of a part of FIG. 1A.

In general, according to one embodiment, a pressing force sensor includes a sensor area, plurality of individual electrodes arranged in a matrix in a first direction and a second direction crossing the first direction in the sensor area, a common electrode opposed to the individual electrodes, a plurality of first spacers arranged between the individual electrodes and the common electrode and overlapping the individual electrodes, and a plurality of second spacers disposed in the sensor area and formed of a different material from the first spacers.

According to another embodiment, a pressing force sensor includes a first base, a transistor disposed on the first base, an insulating layer disposed on the transistor, a sensor area disposed on the first base, a plurality of individual electrodes arranged in a matrix in a first direction and a second direction crossing the first direction in the sensor area, a common electrode opposed to the individual electrodes, a plurality of first spacers arranged between the individual electrodes and the common electrode and overlapping the individual electrodes, and a plurality of second spacers disposed in the sensor area. The individual areas are each electrically connected to the transistor via the insulating layer. The first spacers are formed of a same material as the insulating layer.

According to yet another embodiment, a pressing force sensor includes a sensor area, a plurality of individual electrodes arranged in a matrix in a first direction and a second direction crossing the first direction in the sensor area, a common electrode opposed to the individual electrodes, and a plurality of first spacers arranged between the individual electrodes and the common electrode and overlapping the individual electrodes. The first spacers each include a spacer bead and a curable resin covering the spacer bead.

According to the embodiments, a pressing force sensor which can accurately detect a pressing force can be provided.

The embodiments of the invention will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In the specification and drawings, elements which function in a similar manner to those described in connection with preceding drawings are denoted by the same reference symbols, and detailed explanations of them may be appropriately omitted.

A pressing force sensor according to one embodiment will be described in detail with reference to the accompanying drawings.

A first direction X, a second direction Y and a third direction X are orthogonal to one another in the present embodiment but may cross one another at an angle other than 90 degrees. A direction toward a pointing end of an arrow indicating the third direction Z is defined as upward or above, and a direction opposite to the direction toward the pointing end of the arrow indicating the third direction Z is defined as downward or below.

When described as "the second member above the first member" and "the second member below the first member", the second member may be in contact with the first member or apart from the first member. In the latter case, the third member may be interposed between the first member and the second member. On the other hand, when described as "the second member on/over the first member" and "the second member on/under the first member", the second member is in contact with the first member.

When an observation position at which the pressing force sensor IPD is observed is assumed to be located in the direction toward the pointing end of the arrow indicating the third direction Z, viewing toward an X-Y plane defined by the first direction X and the second direction Y from the observation position is referred to as planar view. Viewing a cross section of the pressing force sensor IPD in an X-Z plane defined by the first direction X and the third direction Z or a Y-Z plane defined by the second direction Y and the third direction Z defined by the second direction Y and the third direction Z is referred to as cross-sectional view.

Embodiment 1

FIG. 1A is an exploded perspective view of the pressing force sensor IPD of the present embodiment. FIG. 1B is an enlarged perspective view of a part of FIG. 1A. The pressing force sensor IPD shown in FIGS. 1A and 1B includes a first substrate SUB1 and a second substrate SUB2.

The first substrate SUB1 of the pressing force sensor (load sensor) IPD includes a first base BA1, a sensor area SA on the first base BA1, a frame area FR surrounding the sensor area SA, and a frame spacer FRS disposed in the frame area FR. The sensor area SA includes a plurality of individual electrodes PE arranged in a matrix in the first direction X and the second direction Y, and a spacer SPC disposed on each individual electrode PE. The pressing force sensor IPD shown in FIG. 1 further includes a wall-shaped auxiliary spacer ADS extending in the first direction X. The spacer SPC is referred to as the first spacer and the auxiliary spacer ADS is referred to as the second spacer in the present embodiment.

The frame spacer FRS is disposed surrounding the sensor area SA, and bonds the first substrate SUB1 and the second substrate SUB2 together. Accordingly, the frame spacer FRS maintains a gap between the first substrate SUB1 and the second substrate SUB2. As the frame spacer FRS, for example, an adhesive or a double-faced tape is used.

The spacer SPC is a member for accurately securing a gap between a pressure-sensitive layer FSL and the individual electrode PE. In FIG. 1A, in order to make the drawing easy to see, the spacers SPC are illustrated only in one row along the first direction X. However, the spacers SPC may be disposed in all rows, that is, for all the individual electrodes PE. Alternatively, the spacers SPC may be disposed not for all the individual electrodes PE but for every plurality of individual electrodes PE. Alternatively, more than one spacer SPC may be disposed overlapping one individual electrode PE.

As will be described later in detail, the auxiliary spacer ADS is illustrated only in one row in FIG. 1A but may be disposed in all rows. Alternatively, the auxiliary spacer ADS may be disposed in every plurality of rows of individual areas PA.

The second substrate SUB2 shown in FIG. 1A includes a second base BA2, a common electrode CE, and a pressure-sensitive layer FSL. The common electrode CE is formed over an area of the second base BA2 which is opposed to the sensor area SA. The details of the pressure-sensitive layer FSL will be described later.

In order to protect the pressing force sensor IPD, a protective film may be disposed above the second substrate SUB2.

Figure 2A:
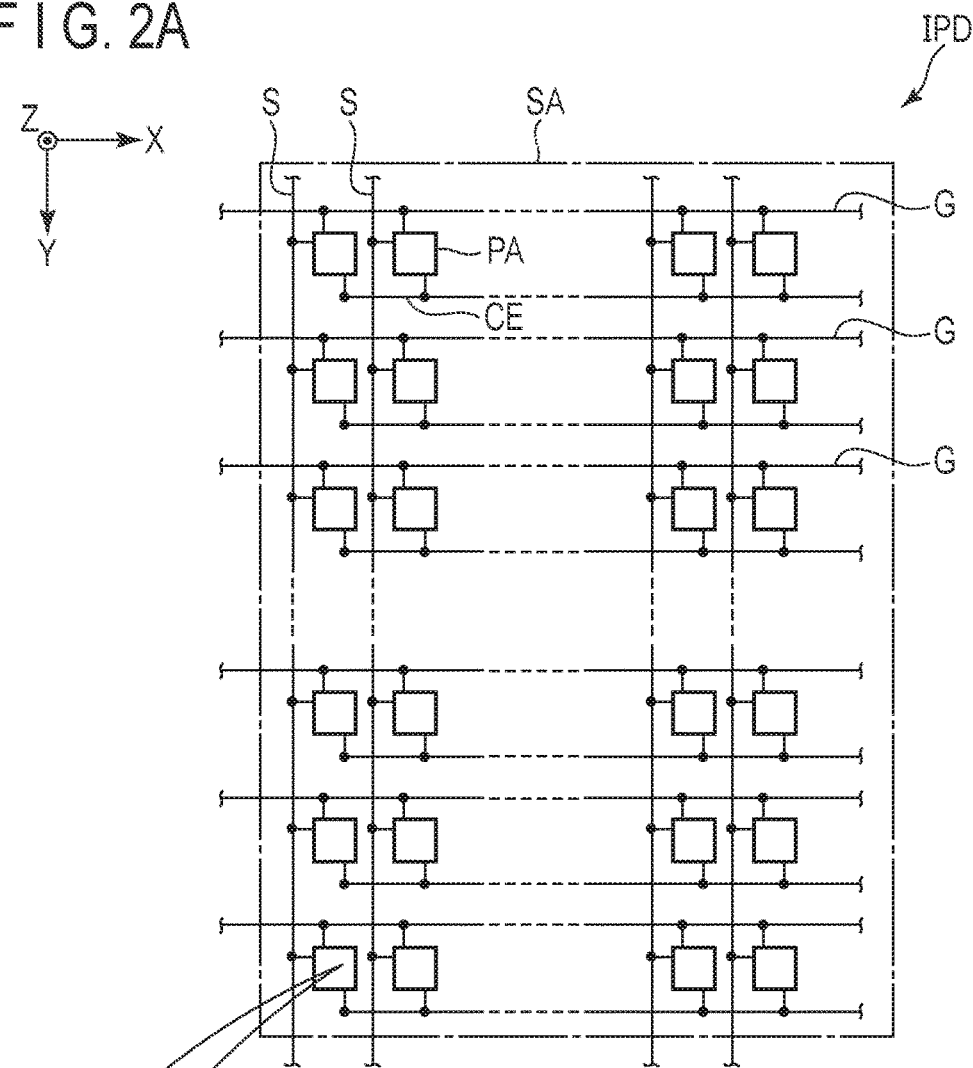
FIG. 2A is a circuit diagram showing the pressing force sensor IPD of Embodiment 1.
Figure 2B:
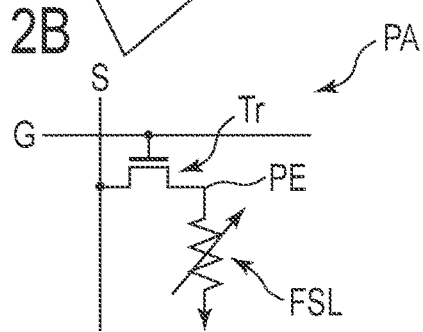
FIG. 2B is an enlarged circuit diagram showing one individual area PA of FIG. 2A.

FIG. 2A is a circuit diagram showing the pressuring force sensor IPD of the present embodiment. FIG. 2B is an enlarged circuit diagram showing one individual area PA of FIG. 2A. The pressing force sensor IPD shown in FIG. 2A includes the individual areas PA arrayed in the matrix, a plurality of scanning line G and a plurality of signal lines S. The scanning lines G extend in the first direction X and are arranged in the second direction Y. The signal lines S extend in the second direction Y and are arranged in the first direction X. The scanning lines G and the signal lines S may not extend straight but partly bent. For example, even if the signal lines S partly bent, the signal lines S are still assumed to extend in the second direction Y.

The individual areas PA are disposed close to the intersections of the scanning lines G and the signal lines S. Each individual area PA includes a transistor Tr, the individual electrode PE, the common electrode CE, the pressure-sensitive layer FSL, and the like. The transistor Tr is composed of a thin-film transistor (TFT) and is electrically connected to the scanning line G and the signal line S. The scanning line G is electrically connected to gate electrodes GE of the transistors Tr in the respective individual areas PA arranged in the first direction X. The signal line S is electrically connected to source regions of the transistors Tr in the respective individual areas PA arranged in the second direction Y. The individual electrode PE is electrically connected to a drain region of the transistor Tr. The respective individual electrodes PE are opposed to the common electrode CE across the pressure-sensitive layer FSL.

Figure 3A:
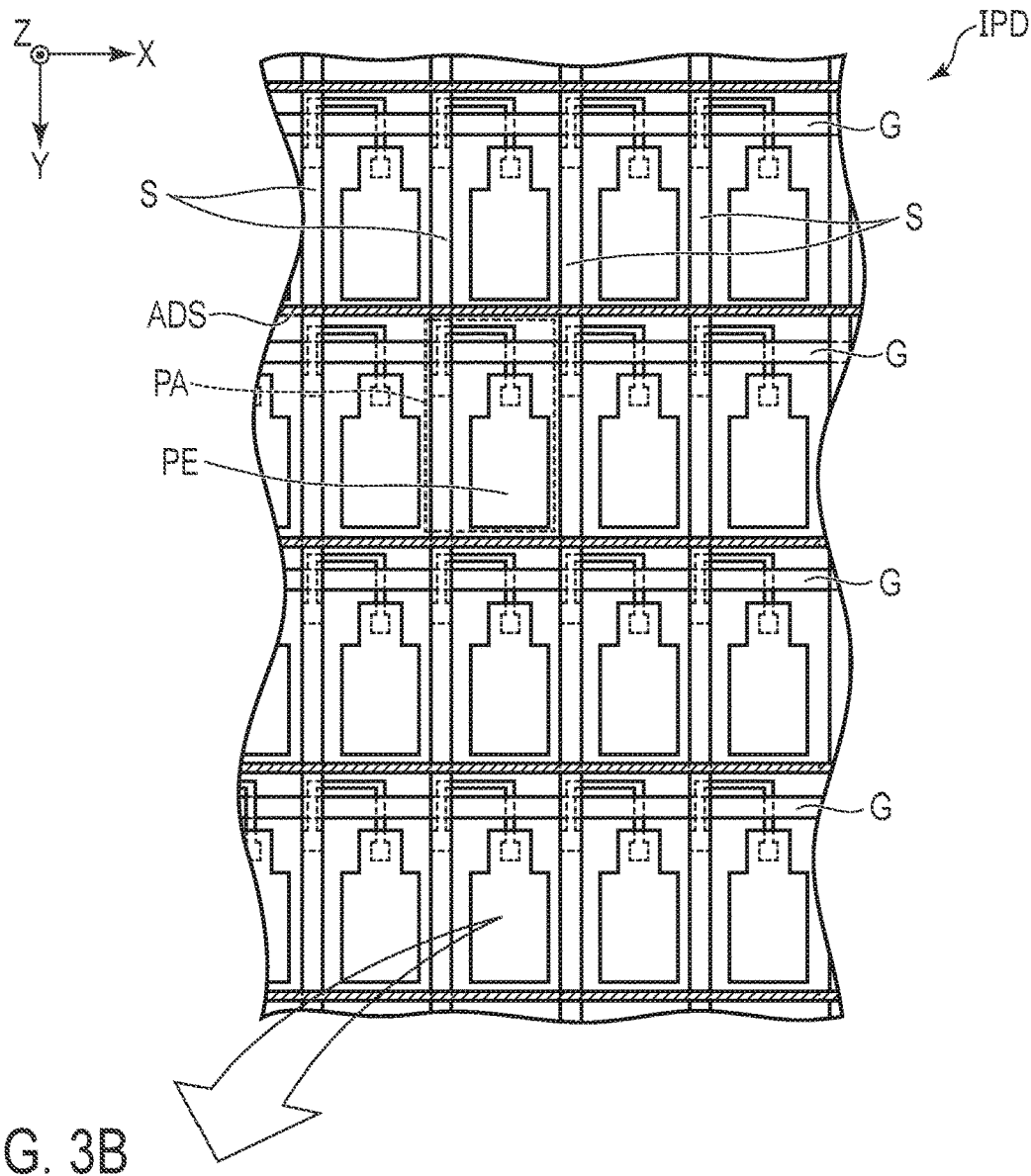
FIG. 3A is a plan view showing the pressing force sensor IPD.
Figure 3B:
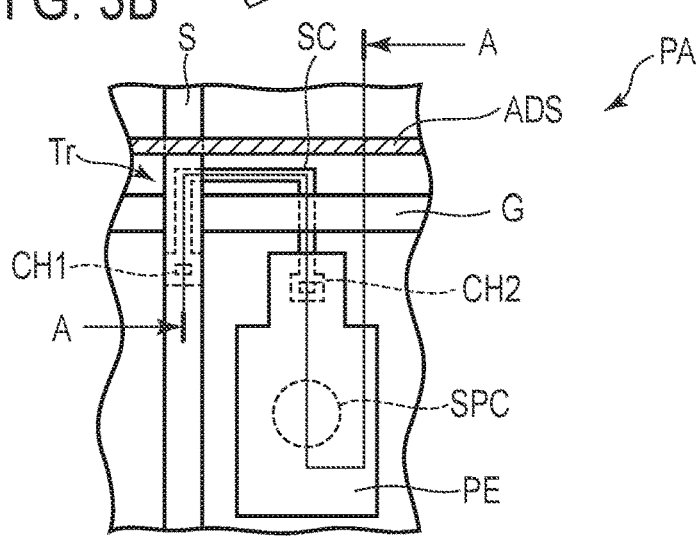
FIG. 3B is an enlarged plan view showing one individual area PA of FIG. 3A.

FIG. 3A is a plan view showing the pressing force sensor IPD. FIG. 3B is an enlarged plan view showing one individual area PA of FIG. 3A. As shown in FIGS. 3A and 3B, the transistor Tr of the individual area PA has a semiconductor layer SC. A source region of the semiconductor layer SC is connected to the signal line S via a contact hole CH1. A drain region of the semiconductor layer SC is connected to the individual electrode PE via a contact hole CH2.

The spacer SPC shown in FIGS. 3A and 3B is disposed inside the individual area PA and is arranged overlapping the individual area PE.

The auxiliary spacer ADS shown in FIG. 3A is disposed over the individual areas PA arranged in the first direction X. The details of the auxiliary spacer ADS will be described later.

The individual electrodes PE of the pressing force sensor IPD have the same shape and the same size in the present embodiment but are not limited to this. The individual electrodes PE of the pressing force sensor IPD may have different shapes. The individual electrodes PE of the pressing force sensor IPD may have different sizes.

Figure 4:
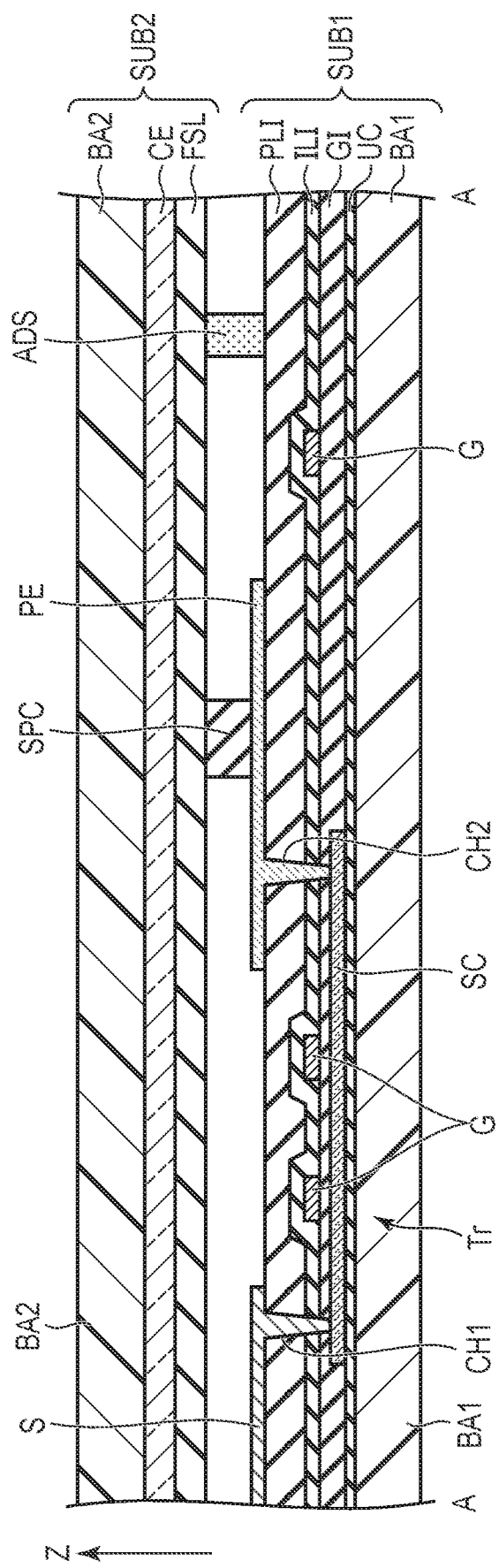
FIG. 4 is a cross-sectional view of the pressing force sensor IPD taken along line A-A of FIG. 3B.

FIG. 4 is a cross-sectional view of the pressing force sensor IPD taken along line A-A of FIG. 3B.

As shown in FIG. 4, the first substrate SUB1 of the pressing force sensor IPD includes the first base BA1, an insulating layer UC, the semiconductor layer SC, an insulating layer GI, the scanning line G, an insulating layer ILI, an insulating layer PLI, the signal line S and the individual electrode PE. The insulating layer US, the semiconductor layer SC, the insulating layer GI, the scanning line G, the insulating layer ILI and the insulating layer PLI are stacked in this order in the third direction Z on the first base BA1. The signal line S and the individual electrode PE are disposed on the insulating layer PLI. The insulating layer ILI may not be provided when not necessary.

In the transistor Tr of the present embodiment, the scanning line G (gate electrode) is disposed on the semiconductor layer SC while sandwiching the insulating layer GI. As described above, the source region of the semiconductor layer SC of the transistor Tr is connected to the signal line S via the contact hole CH1 formed in the insulating layer GI, the scanning line G, the insulating layer ILI and the insulating layer PLI. The drain region of the semiconductor layer SC of the transistor Tr is connected to the individual electrode PE via the contact hole CH2 formed in the insulating layer GI, the scanning line G, the insulating layer ILI and the insulating layer PLI.

The transistor Tr of the present embodiment is a so-called top-gate transistor but is not limited to this. The transistor Tr may be a bottom-gate transistor. The bottom-gate transistor includes the semiconductor layer SC disposed on the scanning line G (gate electrode) via the insulating layer GI, the insulating layer ILI disposed on the semiconductor layer SC and the insulating layer GI, and the signal line S (source electrode) and the individual electrode PE electrically connected to the semiconductor layer SC and disposed on the insulating layer ILI (and the insulating layer PLI).

As the first base BA1 and the second base BA2, a base having flexibility, for example, a resin sheet, more specifically, a polyimide or polyethylene terephthalate (PET) sheet may be used. The first base BA1 may be glass having a small sheet thickness.

The scanning line G and the signal line S are each formed of a metal material such as aluminum (Al), titanium (Ti), silver (Ag), molybdenum (Mo), tungsten (W), copper (Cu) or chromium (Cr), an alloy of these metal materials combined together, or the like. The scanning line G and the signal line S may each have a single-layer structure or a multilayer structure where the above-described metal materials are appropriately stacked.

The insulating layer UC, the insulating layer GI and the insulating layer ILI are each formed of an inorganic insulating material such as silicon oxide (SiO), silicon nitride (SiN) or silicon oxynitride (SiON). The insulating layer UC, the insulating layer GI and the insulating layer ILI may each have a single-layer structure or a multilayer stack structure.

The insulating layer PLI corresponds to an organic insulating layer formed of an organic insulating material such as acrylic or polyimide.

The individual electrode PE and the common electrode CE may be each formed of a conductive material not having translucency, for example, the above-described metal material or alloy. Alternatively, the individual electrode PE and the common electrode CE may be each formed of a transparent conductor such as indium tin oxide (ITO) or indium zinc oxide (IZO).

In the second substrate SUB2 shown in FIG. 4, the common electrode CE is opposed to the individual electrode PE of the first substrate SUB1 with the pressure-sensitive layer FSL interposed therebetween. The pressure-sensitive layer FSL includes an insulating resin and conductive particles. When a pressing force is applied, the pressure-sensitive layer is deformed, the conductive particles inside the insulating resin are brought into contact with one another, and the electric resistance of the pressure-sensitive layer is reduced. When the pressing force is removed, the pressure-sensitive layer is restored to its previous shape before the pressing force is applied by the elasticity of the insulating resin, and is restored to a state where the electric resistance is high.

When the common electrode CE is pressed down toward the individual electrode PE, the individual electrode PE opposed to an area in which the common electrode CE is pressed down (hereinafter referred to as a press-down area) and the common electrode CE are made electrically conductive to each other via the pressure-sensitive layer FSL. The resistance value of the pressure-sensitive layer FSL is changed by an amount (force and/or area) of press-down. When the transistor Tr is in an on state, a current value flowing to the pressure-sensitive layer FSL flows to the signal line S via the transistor Tr, and in a detection circuit connected to the signal line S, how much pressing force is applied to the pressing force sensor IPD is detected.

According to the area of the press-down area, an amount of change of the current value flowing to the pressure-sensitive layer FSL can be detected. Accordingly, a pressing force value applied to the pressing force sensor IPD (referred to also as an amount of force) can be detected. It is possible to detect how much pressing force (that is, pressure) is applied to each individual area PA by sequentially driving the scanning lines G and detecting the amount of current of each signal line S during each sequential driving of the scanning lines G. It is possible to collectively detect an entire pressing force applied to the entire pressing force sensor IPD by setting all the scanning lines G to an on state.

As the pressure-sensitive layer FSL, a transparent conductive material, for example, indium tin oxide (ITO) or indium zinc oxide (IZO) may be used. Also when such a transparent conductive material is used as the pressure-sensitive layer FSL, a pressing force can be detected.

As the pressure-sensitive layer FSL, a coiled metal wire may be used. As described above, when a combination of an insulating resin and conductive particles or a coiled metal wire is used as the pressure-sensitive layer FSL, in some cases, as a pressing force in a predetermined area is increased, the resistance value of the pressure-sensitive layer FSL is reduced. It is possible to use the pressing force sensor IPD as a pressure sensor by using such a material.

When a transparent conductor such as indium tin oxide (ITO) is used as the pressure-sensitive layer FSL, in some cases, only values which can be detected are two values indicating whether the common electrode CE and the individual electrode PE are apart from each other or in contact with each other. However, also in these cases, if a pressing force applying side is a material having flexibility (for example, a finger or a resin), as the pressure applied to the pressing force sensor IPS is increased, the contact area of the material and the pressing force sensor IPD is increased. Accordingly, also when a transparent conductor such as indium tin oxide (ITO) is used as the pressure-sensitive layer FSL, in some cases, it is possible to measure pressure by taking an amount of pressing force and an area in which the pressing force is applied into consideration.

As the pressure-sensitive layer FSL, a semiconductor such as silicon or an insulator such as silicon oxide or polymer that allows a tunnel current to flow may be used instead of a transparent conductor.

The pressure-sensitive layer FSL is disposed on a common electrode CE side but may be disposed on an individual electrode PE side. However, in order to dispose the pressure-sensitive layer FSL on the individual electrode PE side, the pressure-sensitive layer FSL may be patterned in the same shape as the individual electrode PE or may be formed using a material having anisotropic conductivity in order to avoid leakage between the individual electrodes PE which are adjacent to each other. The pressure-sensitive layer FSL may be disposed on both the common electrode CE side and the individual electrode PE side. Although gas is sealed in between the spacers in this structure, the structure is not particularly limited to this.

When a transparent conductor is used as the pressure-sensitive layer FSL, the pressure-sensitive layer FS1 may also function as the common electrode CE. That is, the pressure-sensitive layer FSL and the common electrode CE may not be separately provided but may be a single layer.

The resistance value (conductivity) of the pressure-sensitive layer FSL can be appropriately changed by the layer thickness, material or the like of the pressure-sensitive layer FSL.

As shown in FIG. 4, the pressing force sensor IPD includes the spacer SPC between the first substrate SUB1 and the second substrate SUB2, more specifically, between the individual electrode PE and the pressure-sensitive layer FSL. The spacer SPC prevents the pressure-sensitive layer FSL (and the common electrode CE) from being brought into contact with the individual electrode PE by its own weight (their own weights). An example of the material of the spacer PSC is a resin material, more specifically, acrylic resin, epoxy resin, polyimide resin, novolak resin or the like.

The frame spacer FRS and the spacer SPC each have a function of maintaining the gap between the first substrate SUB1 and the second substrate SUB2. However, when the first base BA1 of the first substrate SUB1 and the second base BA2 of the second substrate SUB2 are bases having flexibility, for example, resin sheets or the like, in some cases, the position of the spacer SPC corresponding to the individual electrode PE shifts. In particular, the second substrate SUB2 is frequently bent by a pressing force, and such a position shift is likely to occur. Accordingly, a shift and a wrinkle may occur in the second substrate SUB2 and the first substrate SUB1. When the curvature of the second substrate SUB2 increases, the frame spacer FRS and the spacer SPC are peeled off. Consequently, the pressing force sensor IPD cannot correctly detect a pressing force.

In the present embodiment, in consideration of the above, the auxiliary spacer ADS is provided in addition to the frame spacer FRS and the spacer SPC. As shown in FIG. 4, the auxiliary spacer ADS is disposed on the insulating layer PLI and is located between the insulating layer PLI and the pressure-sensitive layer FSL.

The auxiliary spacer ADS is formed of a material different from that of the spacer SPC. An example of the material of the auxiliary spacer ADS is an adhesive, for example, an optical clear adhesive (OCA) or an optical clear resin (OCR) which is a UV curable resin.

By providing the auxiliary spacer ADS, the gap between the first substrate SUB1 and the second substrate SUB2 is maintained not only by the frame spacer FRS and the spacer SPC but also by the auxiliary spacer ADS. Accordingly, even when the second base BA2 (and the first base BA1) is (are) bent, occurrence of a shift and a wrinkle in the first substrate SUB1 and the second substrate SUB2 can be suppressed. Even when the curvature of the first substrate SUB1 and the curvature of the second substrate SUB2 are increased by a pressing force, peeling off of the frame spacer FRS and the spacer SPC can be suppressed. From the above, the pressing force sensor IPD of the present embodiment can accurately detect a pressing force.

The auxiliary spacer ADS of the present embodiment is disposed in an area not overlapping the individual electrode PE (see FIGS. 1A and 1B, FIGS. 3A and 3B, and FIG. 4). Accordingly, it is possible to suppress occurrence of a shift and a wrinkle and suppress peeling off of the frame spacer FRS and the spacer SPC without reducing an area which can detect a pressing force.

By providing the auxiliary spacer ADS, a force applied to the frame spacer FRS is reduced. Accordingly, the width of the frame spacer FRS can be reduced, and narrowing of a frame can be achieved.

Figure 5:
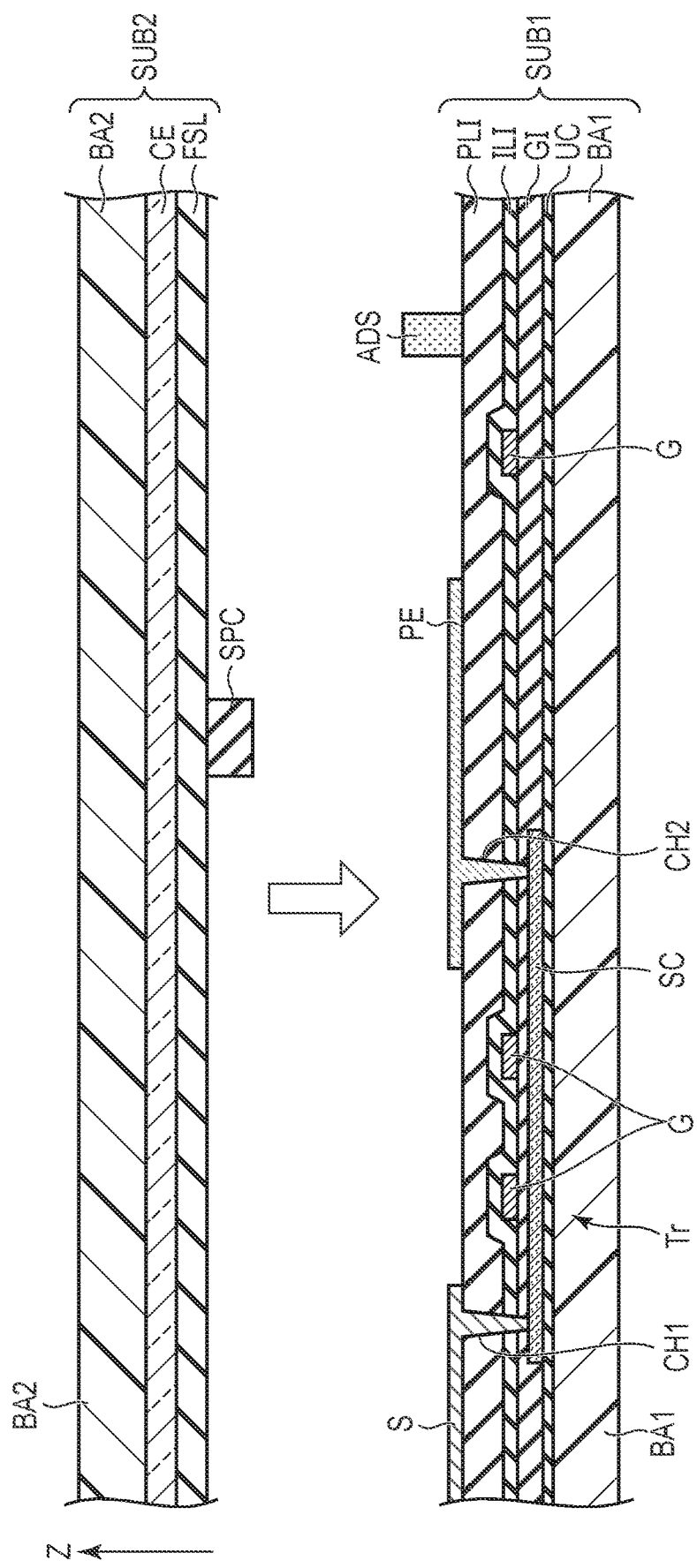
FIG. 5 is a cross-sectional view showing a method of forming an auxiliary spacer ADS.

Here, a method of forming the auxiliary spacer ADS will be described. FIG. 5 is a cross-sectional view showing the method of forming the auxiliary spacer ADS.

First, the configuration up to the insulating layer PLI shown in FIG. 4 is formed on the first base BA1. The individual electrode PE electrically connected to the transistor Ts is formed on the insulating layer PLI. The auxiliary spacer ADS is formed on the insulating layer PLI. Although not shown in the drawing, the frame spacer FRS is also formed in the first substrate SUB1. The first substrate SUB1 is thereby formed.

The common electrode CE and the pressure-sensitive layer FSL are formed in this order on the second base BA2, and these constitute the second substrate SUB2. The spacer SPC is formed contacting the pressure-sensitive layer FSL. The spacer SPC is disposed at a position opposed to the individual electrode PE.

Then, the first substrate SUB1 and the second substrate SUB2 are bonded together such that the spacer SPC is in contact with the individual electrode PE. Although not shown in the drawing, the frame spacer FRS of the first substrate SUB1 is also in contact with the second substrate SUB2. The auxiliary spacer ADS is in contact with the pressure-sensor layer FSL of the second substrate SUB2 as shown in FIG. 4. After that, in a case where curing is necessary for the auxiliary spacer ADS, curing is carried out and the auxiliary spacer ADS is fixed.

Figure 6A:
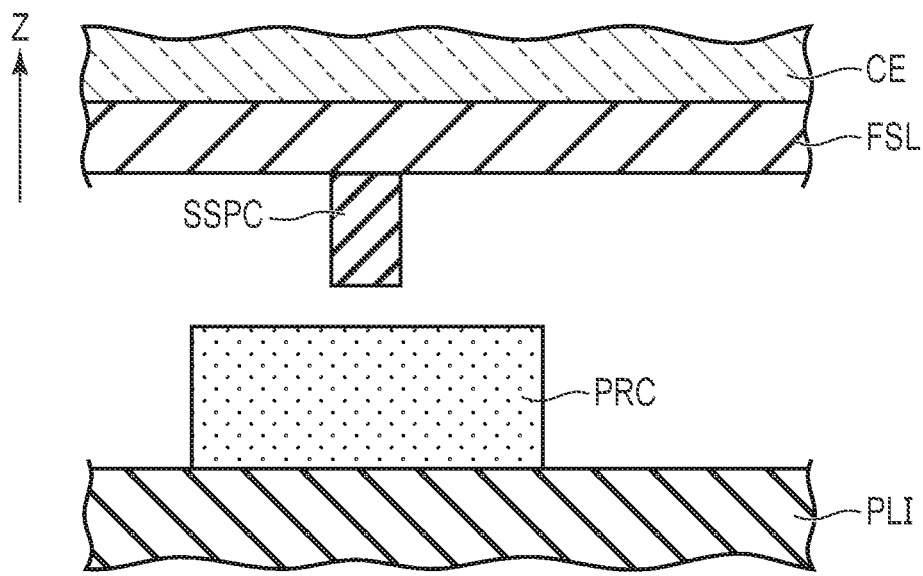
FIG. 6A is an enlarged cross-sectional view showing the method of forming the auxiliary spacer ADS.
Figure 6B:
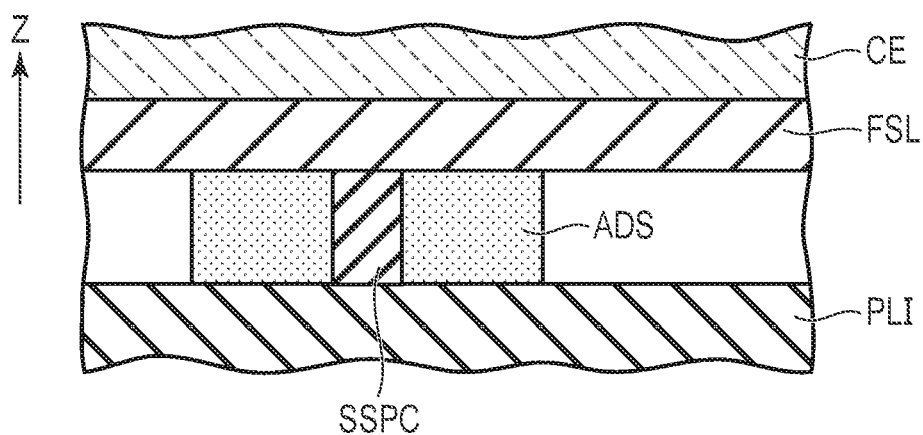
FIG. 6B is an enlarged cross-sectional view showing the method of forming the auxiliary spacer ADS.

Since the spacer SPC has a sufficient strength for maintaining the gap between the first substrate SUB1 and the second substrate SUB2, the spacer SPC may be disposed inside the auxiliary spacer ADS. FIGS. 6A and 6B are enlarged cross-sectional views showing the method of forming the auxiliary spacer ADS.

First, as shown in FIG. 6A, a precursor PRC of the auxiliary spacer ADS is disposed on the insulating layer PLI of the first substrate SUB1. A spacer SSPC is formed at a position being in contact with the pressure-sensitive layer FSL of the second substrate SUB2 and opposed to the precursor PRC of the auxiliary spacer ADS.

Then, as shown in FIG. 6B, the first substrate SUB1 and the second substrate SUB2 are bonded together such that the spacer SSPC is in contact with the insulating layer PLI. At this time, the spacer SSPC is arranged inside the precursor PRC of the auxiliary spacer ADS.

Then, the precursor PRC is cured, and the auxiliary spacer ADS is thereby formed.

Figure 7:
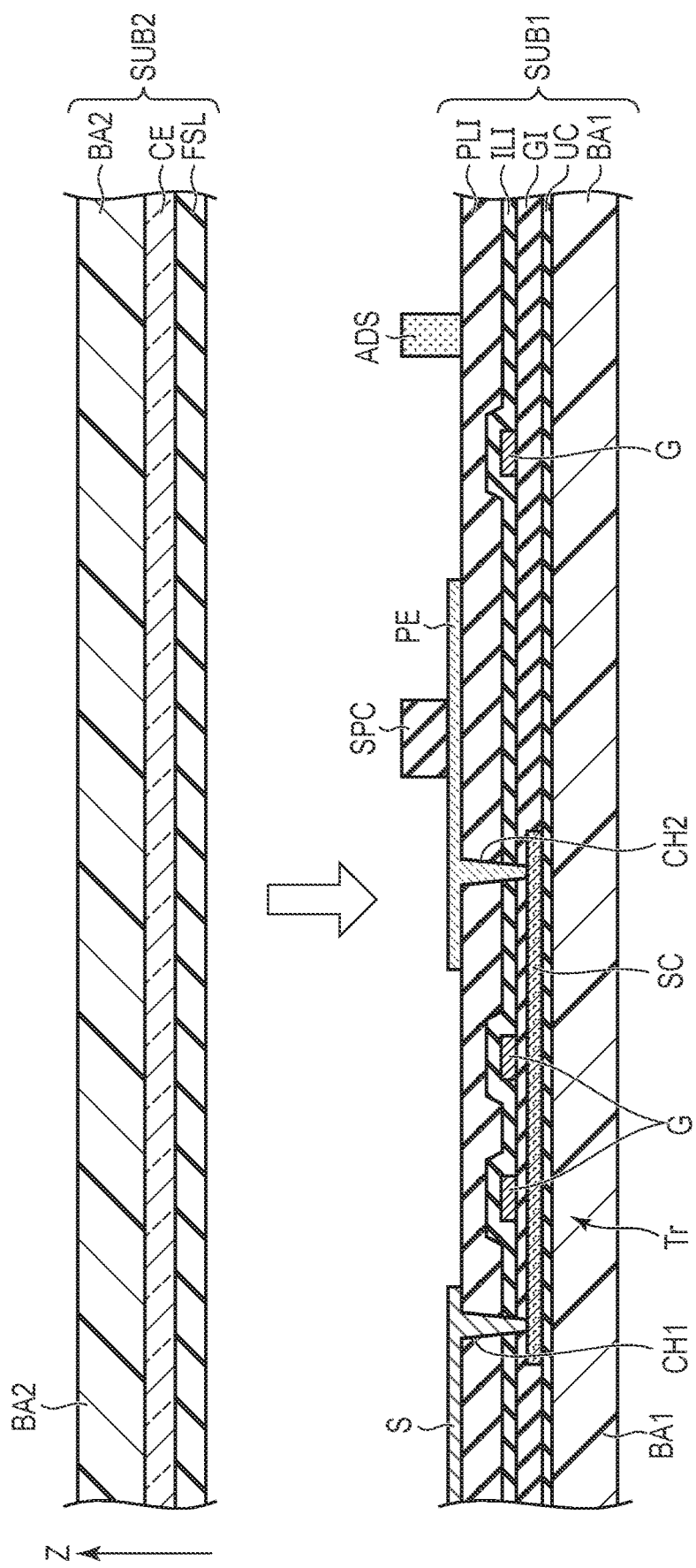
FIG. 7 is a cross-sectional view showing the method of forming the auxiliary spacer ADS.

Another method of forming the auxiliary spacer ADS will be described with reference to FIG. 7. FIG. 7 is a cross-sectional view showing the method of forming the auxiliary spacer ADS.

The spacer SPC is disposed on a second substrate SUB2 (second base BA2) side in FIG. 5 but is disposed on a first substrate SUB1 (first base BA1) side in FIG. 7.

First, similarly to FIG. 5, the configuration up to the insulating layer PLI is formed on the first base BA1. The individual electrode PE is formed on the insulating layer PLI. The spacer SPC is formed on the individual electrode PE. The auxiliary spacer ADS is formed on the insulating layer PLI. The first substrate SUB1 is thereby formed.

The common electrode CE and the pressure-sensitive layer FSL are formed in this order on the second base BA2, and these constitute the second substrate SUB2.

Then, the first substrate SUB1 and the second substrate SUB2 are bonded together such that the spacer SPC and the auxiliary spacer ADS of the first substrate SUB1 are in contact with the pressure-sensitive layer FSL of the second substrate SUB2. Although not shown in the drawing, the frame spacer FRS of the first substrate SUB1 is also in contact with the second substrate SUB2. The auxiliary spacer ADS is in contact with the pressure-sensor layer FSL of the second substrate SUB2 as shown in FIG. 4. After that, in a case where curing is necessary for the auxiliary spacer ADS, curing is carried out and the auxiliary spacer ADS is fixed.

Figure 8A:
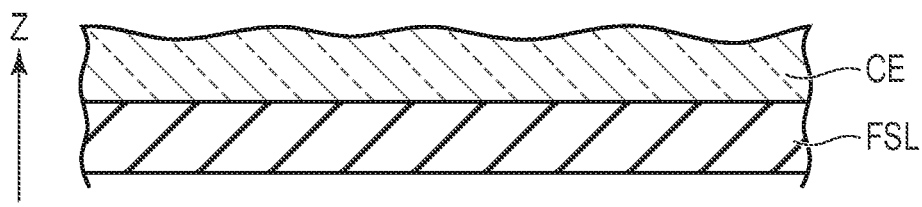
FIG. 8A is an enlarged cross-sectional view showing the method of forming the auxiliary spacer ADS.
Figure 8A:
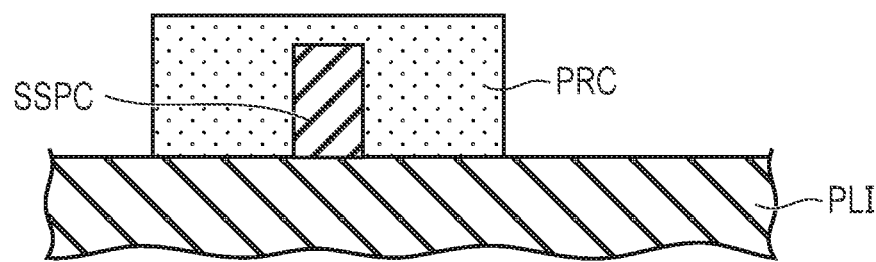
Figure 8B:
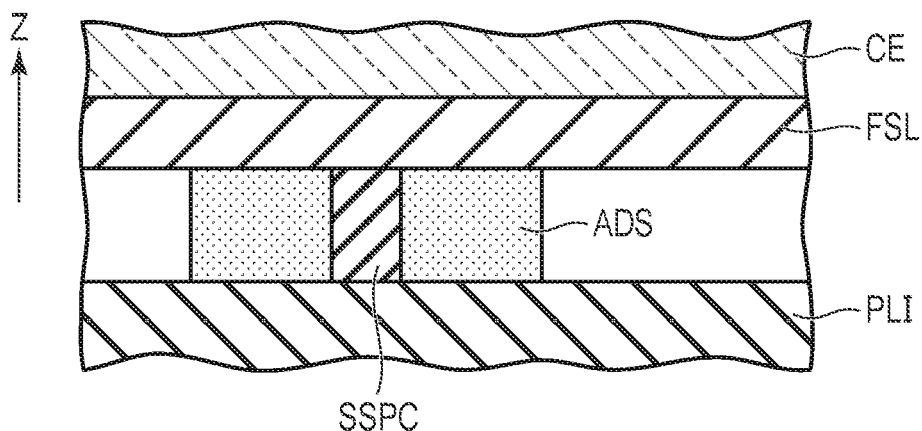
FIG. 8B is an enlarged cross-sectional view showing the method of forming the auxiliary spacer ADS.

Similarly to FIGS. 6A and 6B, the spacer SPC may be disposed inside the auxiliary spacer ADS. FIGS. 8A and 8B are enlarged cross-sectional views showing the method of forming the auxiliary spacer ADS.

First, as shown in FIG. 8A, the spacer SSPC is formed on the insulating layer PLI of the first substrate SUB1. The precursor PRC of the auxiliary spacer ADS is disposed covering the spacer SSPC. In other words, the spacer SSPC is arranged inside the precursor PRC of the auxiliary spacer ADS.

Then, as shown in FIG. 8B, the first substrate SUB1 and the second substrate SUB2 are bonded together such that the pressure-sensitive layer FSL of the second substrate SUB2 is in contact with the spacer SSPC.

Then, the precursor PRC is cured, and the auxiliary spacer ADS is thereby formed.

The auxiliary spacer ADC includes the spacer SSPC inside in FIGS. 6A and 6B, FIG. 7 and FIGS. 8A and 8B. However, the present embodiment is not limited to this configuration. The present embodiment may have the structure that the spacer SPC and the auxiliary spacer ADC are apart from each other.

From the above, according to the present embodiment, occurrence of a shift and a wrinkle in the first substrate SUB1 and the second substrate SUB2 can be suppressed in the pressing force sensor IPD. In addition, peeling off of the frame spacer FRS and the spacer SPC of the pressing force sensor IPD can be suppressed. Accordingly, the pressing force sensor IPD of the present embodiment can correctly detect a pressing force.

Configuration Example 1

Figure 9A:
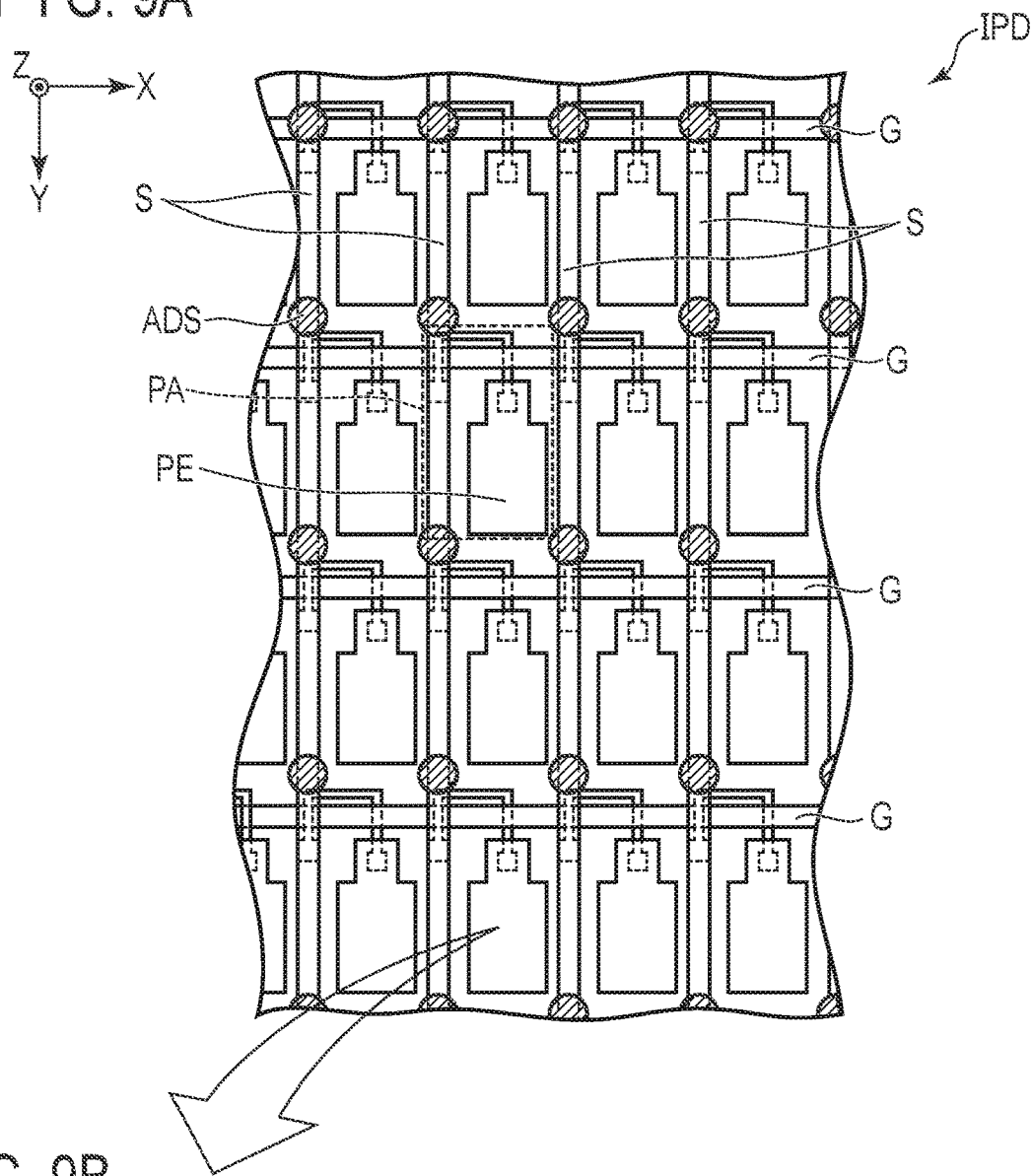
FIG. 9A is a plan view showing another configuration example of the pressing force sensor.
Figure 9B:
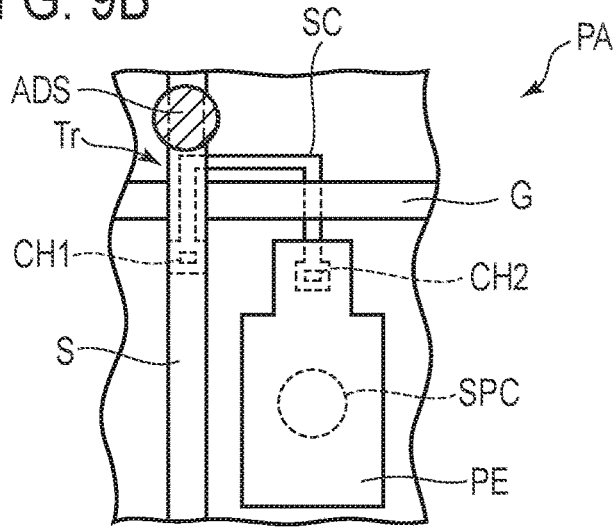
FIG. 9B is an enlarged plan view showing one individual area PA of FIG. 9A.

FIGS. 9A and 9B are plan views showing another configuration example of the pressing force sensor in the present embodiment. The configuration example shown in FIGS. 9A and 9B is different from the configuration example shown in FIGS. 3A and 3B in that the auxiliary spacer has a different shape and the auxiliary spacers are formed surrounding the individual electrodes.

FIG. 9A is a plan view showing the pressing force sensor IPD of the present configuration example. FIG. 9B is an enlarged plan view showing one individual area PA of FIG. 9A. The auxiliary spacers ADS shown in FIGS. 9A and 9B are disposed being scattered in dots in planar view. The auxiliary spacers ADS are disposed surrounding the individual electrodes PE in an area not overlapping the individual electrodes PE. Since the auxiliary spacers ADS do not overlap the individual electrodes PE, it is possible to detect a pressing force without reducing an area which can detect a pressing force.

The auxiliary spacers ADS shown in FIGS. 9A and 9B are disposed such that four auxiliary spacers ADS are disposed around one individual electrode PE but are not limited to this configuration. The number of auxiliary spacers ADS can be appropriately changed. The number of auxiliary spacers ADS may be changed in every plurality of individual areas PA. That is, the scattering density of the auxiliary spacer ADS may be non-uniform.

The auxiliary spacer ADS shown in FIGS. 9A and 9B overlaps the signal line S but does not overlap the transistor Tr. Since the auxiliary spacer ADS does not overlap the transistor Tr, a change of the characteristics of the transistor Tr by a pressing force can be suppressed. Although the auxiliary spacer ADS overlapping the signal line S is shown in FIGS. 9A and 9B, the auxiliary spacer may overlap the scanning line G. Alternatively, the auxiliary spacer ADS may not overlap either of the signal line S and the scanning line G.

Also in the present configuration example, similar effects to those of the above-described embodiment can be produced.

Configuration Example 2

Figure 10:
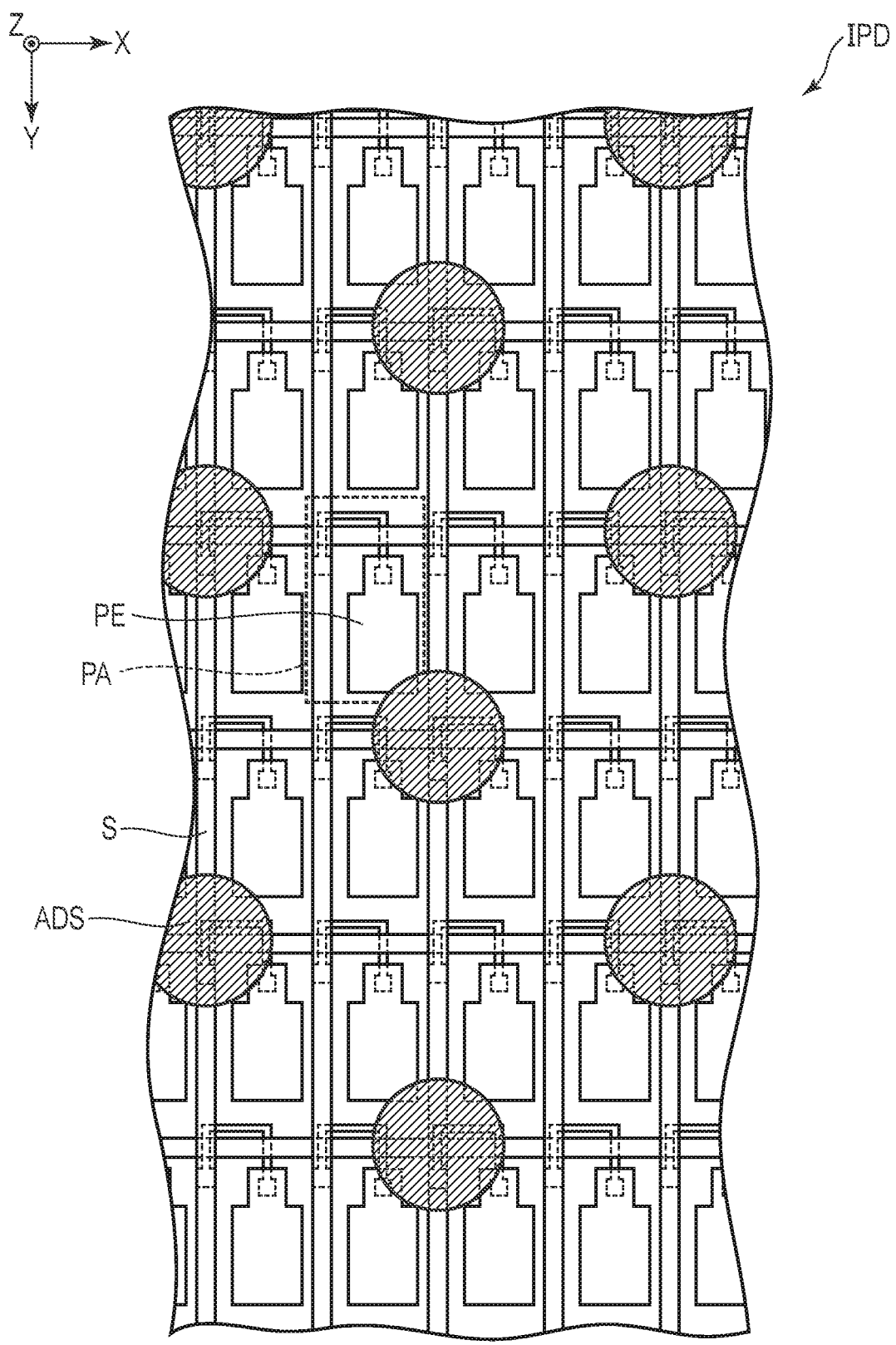
FIG. 10 is a plan view showing another configuration example of the pressing force sensor.

FIG. 10 is a plan view showing another configuration example of the pressing force sensor in the present embodiment. The configuration example shown in FIG. 10 is different from the configuration example shown in FIGS. 9A and 9B in that one part of the auxiliary spacer ADS overlaps the individual electrode PE but the other part does not overlap the individual electrode PE.

Since the auxiliary spacer ADS shown in FIG. 10 has a larger area in planar view as compared with the auxiliary spacer ADS shown in FIGS. 9A and 9B, it is possible to tolerate a higher pressing force.

Since the auxiliary spacer ADS of FIG. 10 only partly overlaps the individual electrode PE, it is possible to detect a pressing force without reducing an area which can detect a pressing force. However, it is preferable that the overlapping area of the auxiliary spacer ADS and the individual electrode PE should have a size which does not affect detection of a pressing force. In order to increase the adherence of the auxiliary spacer ADS and the insulating layer PLI, the individual electrode PE at a position at which the auxiliary spacer ADS is disposed may be removed. That is, the shape of the individual electrode PE in the individual area PA in which the auxiliary spacer ADS is disposed may be different from the shape of the individual electrode PE in the individual area PA in which the auxiliary spacer ADS is not disposed.

In the pressing force sensor IPD shown in FIG. 10, the auxiliary spacer ADS is disposed in every four individual areas PA in the first direction X and every two individual area PA in the second direction Y. However, the auxiliary spacer ADS is not limited to this. The pitch in the first direction X and the pitch in the second direction Y of the auxiliary spacer ADS may be different from each other, and the arrangement density of the auxiliary spacer ADS may be changed depending on the area of the sensor area. That is, the scattering density of the auxiliary spacer ADS may be non-uniform. The planar shape of the auxiliary spacer ADS is not limited to a circular shape but may be an elliptical shape or a diagonal shape.

Also in the present configuration example, similar effects to those of the above-described embodiment can be produced.

Configuration Example 3

Figure 11A:
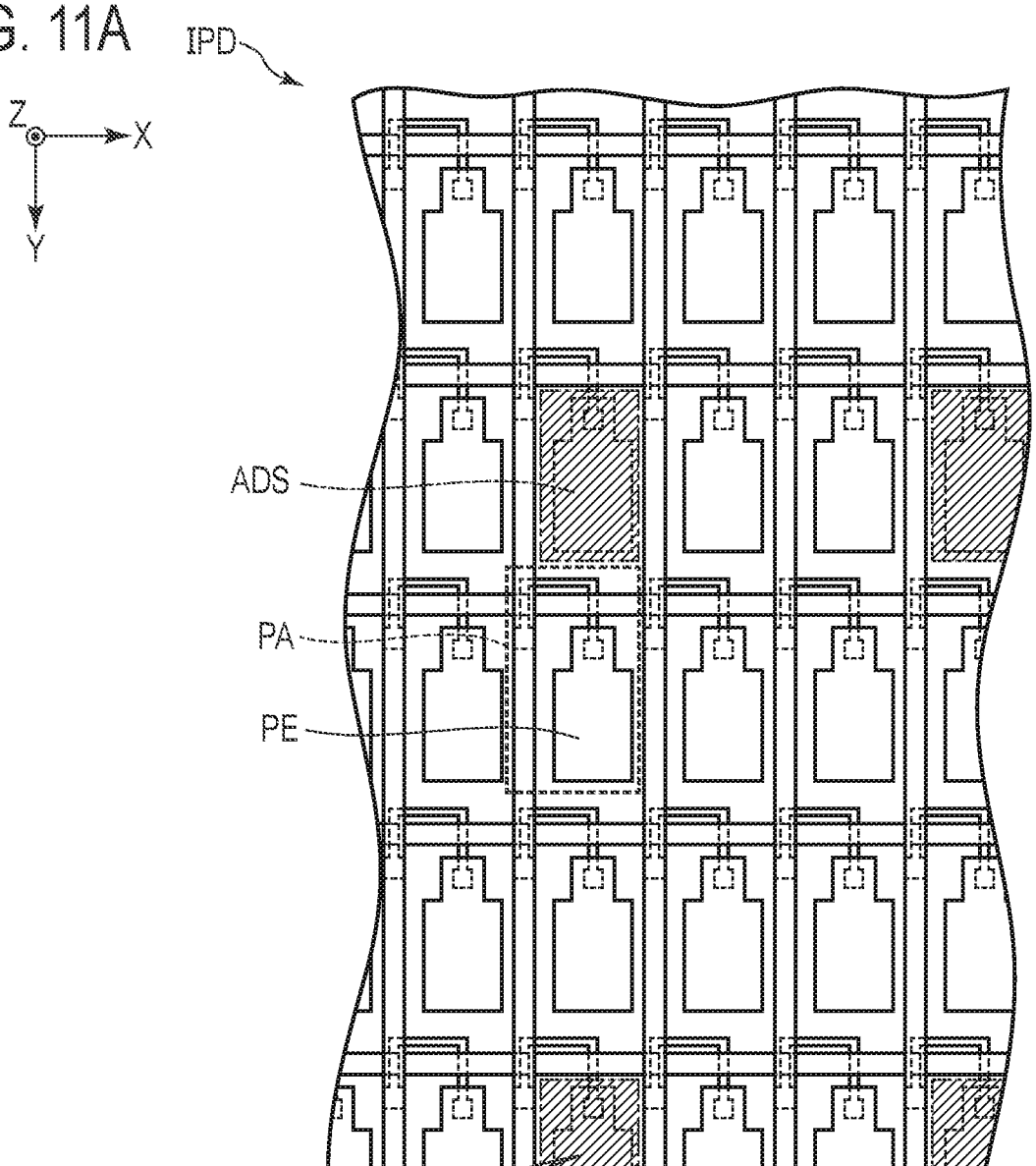
FIG. 11A is a plan view showing another configuration example of the pressing force sensor.
Figure 11B:
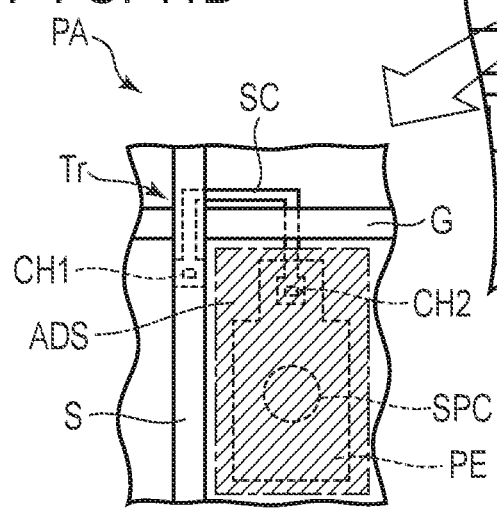
FIG. 11B is an enlarged plan view showing one individual area PA of FIG. 11A.

FIGS. 11A and 11B are plan views showing another configuration example of the pressing force sensor in the present embodiment. The configuration example shown in FIGS. 11A and 11B is different from the configuration example shown in FIGS. 3A and 3B in that the auxiliary spacer ADS covers the individual electrode PE.

FIG. 11A is a plan view showing the pressing force sensor IPD of the present configuration example. FIG. 11B is an enlarged plan view showing one individual area PA of FIG. 11A. The auxiliary spacer ADS shown in FIGS. 11A and 11B covers the individual electrode PE of the individual area PA. In the individual electrode PE covered with the auxiliary spacer ADS, the gap between the individual electrode PE and the pressure-sensitive layer FSL does not change even when a pressing force is applied, and therefore an amount of pressing force cannot be detected. In this case, an amount of pressing force is detected in an individual area PA adjacent to the individual area PA and not overlapping the auxiliary spacer ADS, and an amount of pressure sensor in the individual area PA overlapping the auxiliary spacer ADS is estimated from the result. In the individual area PA overlapping the auxiliary spacer ADS, the individual electrode PE and the thin-film transistor (transistor Tr) may not be disposed. The number of individual areas PA overlapping the auxiliary spacers ADS disposed corresponding to one scanning line G may be uniform over the scanning lines G or different within a range which does not affect the capacitance of the scanning line G.

In the pressing force sensor IPD shown in FIG. 11A, one auxiliary spacer ADS is disposed in one of 3×3 individual areas PA. However, the auxiliary spacer ADS is not limited to this. The number of auxiliary spacers ADS can be appropriately changed. The number of auxiliary spacers ADS may be changed in every plurality of individual areas PA. That is, the scattering density of the auxiliary spacer ADS may be non-uniform.

Also in the present configuration example, similar effects to those of the above-described embodiment can be produced.

Configuration Example 4

Figure 12:
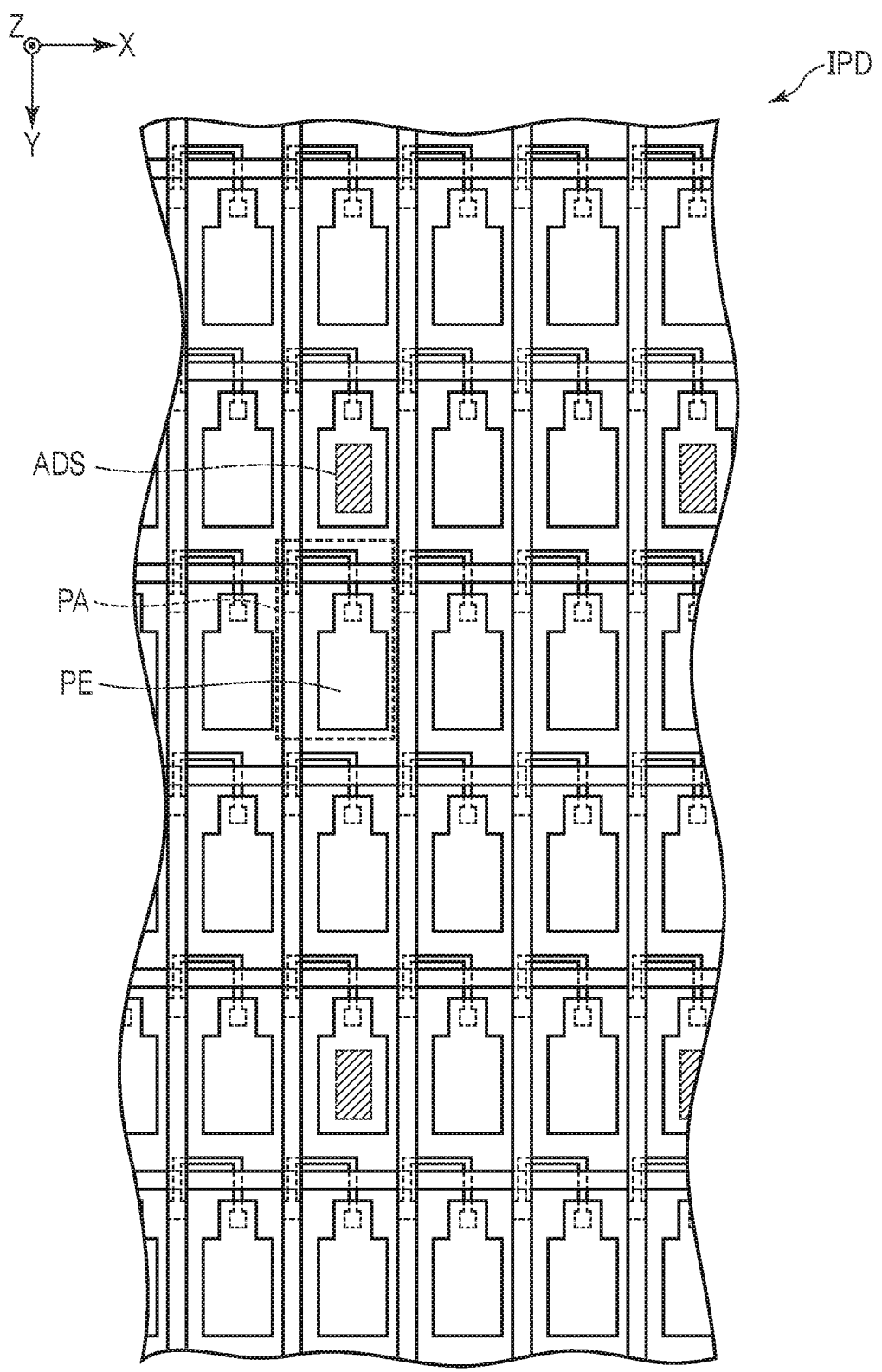
FIG. 12 is a plan view showing another configuration example of the pressing force sensor.

FIG. 12 is a plan view showing another configuration example of the pressing force sensor in the present embodiment. The configuration example shown in FIG. 12 is different from the configuration example shown in FIGS. 11A and 11B in that the auxiliary spacer ADS is smaller than the individual electrode PE.

FIG. 12 is a plan view showing the pressing force sensor IPD of the present configuration example. The auxiliary spacer ADS shown in FIGS. 11A and 11B overlaps the individual electrode PE of the individual area PA but is smaller than the individual electrode PE in planar view. That is, one part of the pixel electrode PE overlaps the auxiliary spacer ADS but the other part does not overlap the auxiliary spacer ADS.

Since the auxiliary spacer ADS of FIG. 12 only partly overlaps the individual electrode PE, it is possible to detect a pressing force without reducing an area which can detect a pressing force.

Also in the present configuration example, similar effects to those of the above-described embodiment can be produced.

Configuration Example 5

Figure 13:
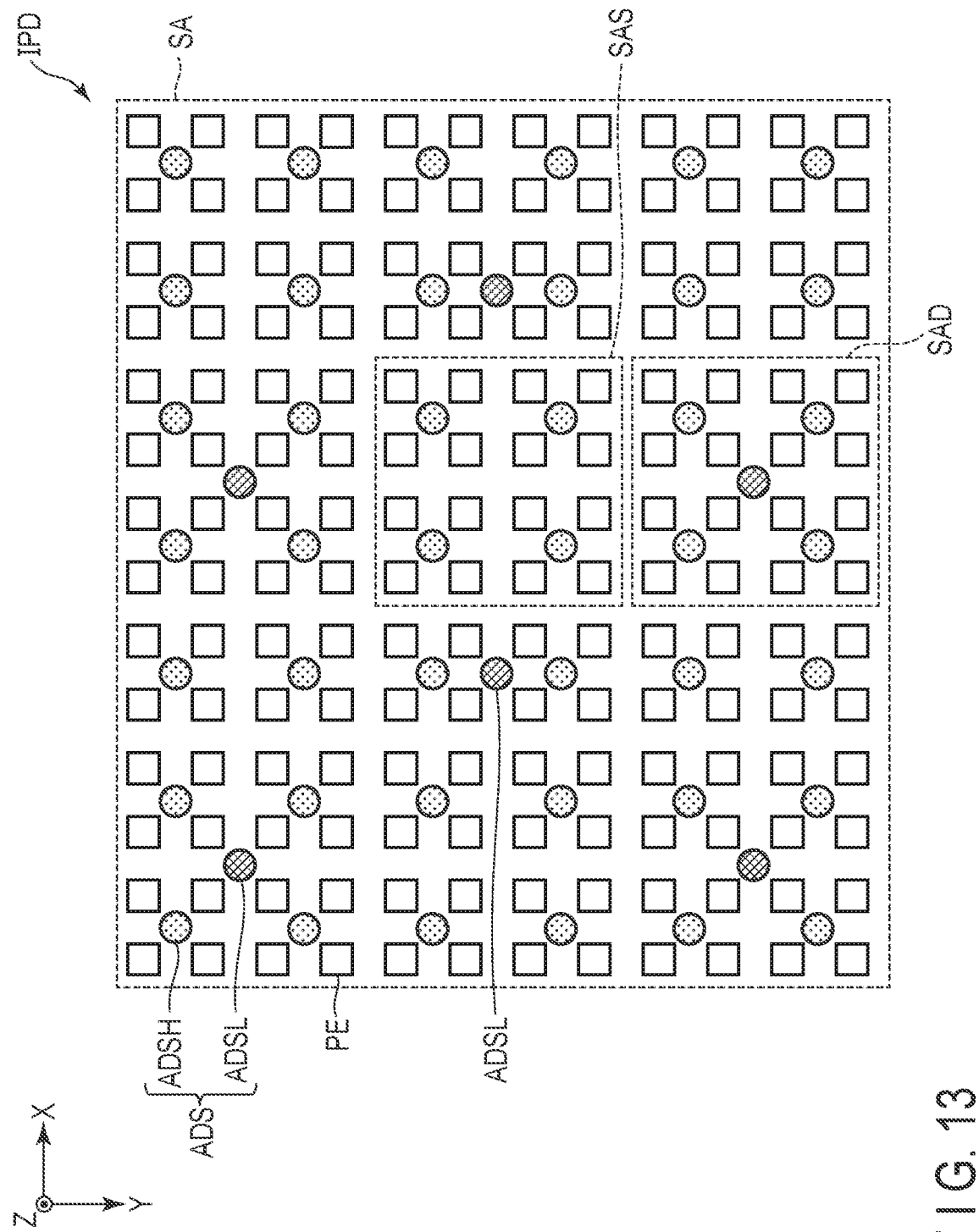
FIG. 13 is a plan view showing another configuration example of the pressing force sensor.

FIG. 13 is a plan view showing another configuration example of the pressing force sensor in the present embodiment. The configuration example shown in FIG. 13 is different from the configuration example shown in FIGS. 9A and 9B in that the scattering density of the auxiliary spacer ADS is non-uniform.

FIG. 13 shows the sensor area SA of the pressing force sensor IPD of the present configuration example. The individual electrodes PE arranged in a matrix in the first direction X and the second direction Y are disposed in the sensor area SA. An auxiliary spacer ADSH is arranged for every two individual electrodes PE (individual areas PA) along the first direction X and every two individual electrodes PE along the second direction Y. An auxiliary spacer ADSL is arranged for every six individual electrodes PE along the first direction X and every four individual electrodes PE along the second direction Y. In rows in which the auxiliary spacers ADSL are arranged, auxiliary spacers ADSL in rows adjacent to each other are arranged being staggered. That is, an auxiliary spacer ADSL closest to one auxiliary spacer ADSL is arranged at a position four rows and three columns away from it.

The auxiliary spacers ADSH and ADSL are formed of the same material. Although the auxiliary spacers ADSH and ADSL are separately illustrated in FIG. 13 so that they are easy to see, the auxiliary spacers ADSH and ADSL are equivalent to the auxiliary spacer ADS. In the present configuration example, the number of spacers SPC is constant regardless of area.

As shown in FIG. 13, an area SAD in which the scattering density of the auxiliary spacer ADS is high and an area SAS in which the scattering density is low are formed in the sensor area SA. More specifically, in the area SAD, five auxiliary spacers ADS are arranged for 4×4 individual electrodes PE (individual areas PA). In the area SAS, four auxiliary spacers ADS are arranged for 4×4 individual electrodes PE (individual areas PA). The number of auxiliary spacers ADS per unit area of the area SAD is greater than that of the area SAS.

As shown in FIG. 13, in a case where the scattering density of the auxiliary spacer ADS is non-uniform, when a pressing force is low, the area SAS in which the scattering density of the auxiliary spacer ADS is low is more likely to be bent. Therefore, the area SAS can detect a low pressing force.

On the other hand, when a pressing force is high, the area SAD in which the scattering density is high is also bent, and the pressing force is detected also in the area SAD.

From the above, it can be said that the area SAS is an area for a low pressing force and the area SAD is an area for a high pressing force. By providing the area for the low pressing force and the area for the high pressing force, the dynamic range of the pressing force sensor IPD is increased.

The present configuration example which has been described is a case where the scattering density of the auxiliary spacer is changed in the configuration example of FIGS. 9A and 9B. However, the present configuration example is not limited to this. The present configuration example can be applied to any of Embodiment 1 and its configuration examples.

Also in the present configuration example, similar effects to those of the above-described embodiment can be produced.

Configuration Example 6

FIGS. 14A and 14B are plan views showing another configuration example of the pressing force sensor in the present embodiment. The configuration example shown in FIGS. 14A and 14B is different from the configuration example shown in FIGS. 9A and 9B in that the number of auxiliary spacers is changed depending on the hardness of the spacer. In the present configuration example, the spacer SPC and the auxiliary spacer ADS have the same size in planar view.

FIG. 14A shows the sensor area SA of the pressing force sensor IPD of the present configuration example. In the sensor area SA, the spacer SPC is arranged for every two individual electrodes PE (individual areas PA) along the first direction X and every individual electrode PE along the second direction Y. In rows in which the spacers SPC are arranged, spacers SPC in rows adjacent to each other are arranged being staggered. That is, a spacer SPC closest to one spacer SPC is arranged at a position one row and one column away from it.

The auxiliary spacer ADS show in FIG. 14A is formed of a material harder than that of the spacer SPC. When the auxiliary spacer ADS is harder than the spacer SPC, even if the number of auxiliary spacers ADS is less than the number of spacers SPC, it is possible to tolerate a pressing force. Therefore, in the pressing force sensor IPD shown in FIG. 14A, the number of auxiliary spacers can be made less than the number of spacers SPC.

When the auxiliary spacer ADS is made of a material harder than that of the spacer SPC, the number of auxiliary spacers ADS can be reduced as described above, and the manufacturing process can be simplified. In a case where translucency is required for the pressing force sensor IPD, when the number of auxiliary spacers ADS is reduced, an area which transmits light is increased. Therefore, the translucency of the entire pressing force sensor IPD is increased.

The auxiliary spacer ADS is arranged for every four individual electrodes PE (individual electrodes PA) along the first direction X and every two individual electrodes PE along the second direction Y. In rows in which the auxiliary spacers ADS are arranged, auxiliary spacers ADS in rows adjacent to each other are arranged being staggered. That is, an auxiliary spacer ADS closest to one auxiliary spacer ADS is arranged at a position two rows and two columns away from it. Since the spacers SPC adjacent to each other are arranged one row and one column away from each other as described above, the number of auxiliary spacers ADS is less than the number of spacers SPC.

In other words, when the number of auxiliary spacers ADS per unit area is less than the number of spacers SPC per unit area, it is only necessary that the hardness of the auxiliary spacer ADS should be greater than the hardness of the spacer SPC. In other words, when the occupation area of the auxiliary spacer ADS per unit area is less than the occupation area of the spacer SPC per unit area, it is only necessary that the hardness of the auxiliary spacer ADS should be greater than the hardness of the spacer SPC.

However, the number of spacers SPC and the number of auxiliary spacers ADS are not limited to the above. As long as the number of auxiliary spacers ADS is less than the number of spacers SPC, these can be appropriately changed.

Although the spacer SPC and the auxiliary spacer have the same size as described above, when the spacer SPC and the auxiliary spacer are compared in terms of occupation area per unit area, the spacer SPC and the auxiliary spacer may have different sizes. That is, when the auxiliary spacer ADS is harder than the spacer SPC, regardless of the size of the spacer SPC and the size of the auxiliary spacer, it is only necessary that the occupation area of the auxiliary spacer ADS per unit area should be less than the occupation area of the spacer SPC per unit area.

FIG. 14B shows the sensor area SA of the pressing force sensor IPD of the present configuration example. In the sensor area SA shown in FIG. 14B, the number of spacers SPC is similar to that of FIG. 14A.

The auxiliary spacer ADS shown in FIG. 14B is formed of a material softer than that of the spacer SPC. When the auxiliary spacer ADS is softer than the spacer SPC, it is possible to tolerate a pressing force by making the number of auxiliary spacers ADS greater than the number of spacers SPC. Therefore, in the pressing force sensor IPD shown in FIG. 14B, the number of auxiliary spacers is greater than the number of spacers SPC.

When the auxiliary spacer ADS is formed of a material softer than that of the spacer SPC, the auxiliary spacer ADS does not interfere with the function of the spacer SPC. That is, the auxiliary spacer ADS does not affect detection of a pressing force and an amount of change (amount of pressing force).

In FIG. 14B, the auxiliary spacer ADS is arranged for every individual electrode PE along the first direction X and the second direction Y. Since the spacers SPC adjacent to each other are arranged two rows and two columns away from each other as described above, the number of auxiliary spacers ADS is greater than the number of spacers SPC.

In other words, when the number of auxiliary spacers ADS per unit area is greater than the number of spacers SPC per unit area, it is only necessary that the hardness of the auxiliary spacer ADS should be less than the hardness of the spacer SPC. In other words, when the occupation area of the auxiliary spacer ADS per unit area is greater than the occupation area of the spacer SPC per unit area, it is only necessary that the hardness of the auxiliary spacer ADS should be less than the hardness of the spacer SPC.

However, the number of spacers SPC and the number of auxiliary spacers ADS are not limited to the above. As long as the number of auxiliary spacers ADS is greater than the number of spacers SPC, these can be appropriately changed.

Similarly to FIG. 14A, when the spacer SPC and the auxiliary spacer are compared in terms of occupation area per unit area, the spacer SPC and the auxiliary spacer may have different sizes. That is, when the auxiliary spacer ADS is softer than the spacer SPC, regardless of the size of the spacer SPC and the size of the auxiliary spacer, it is only necessary that the occupation area of the auxiliary spacer ADS per unit area should be greater than the occupation area of the spacer SPC per unit area.

Also in the present configuration example, similar effects to those of the above-described embodiment can be produced.

Embodiment 2

Figure 15:
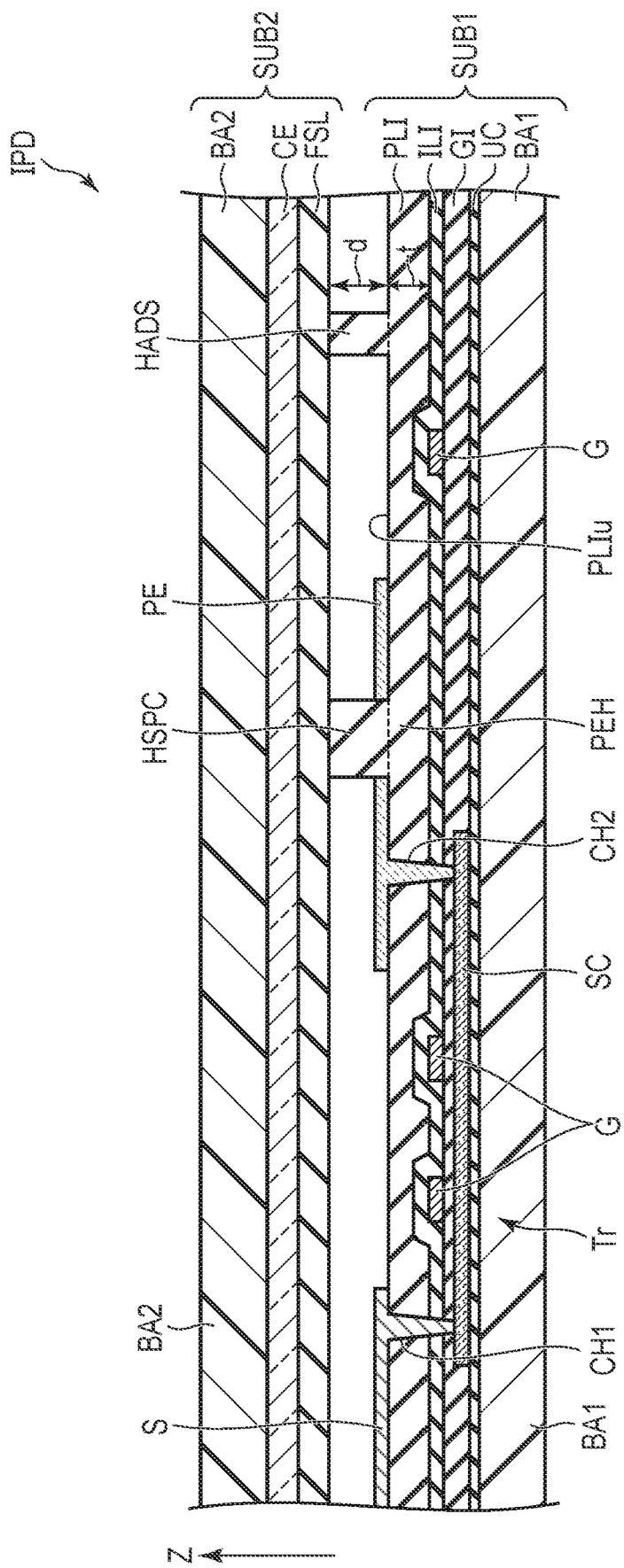
FIG. 15 is a cross-sectional view showing a pressing force sensor IPD of Embodiment 2.

FIG. 15 is a cross-sectional view showing the pressing force sensor IPD of the present embodiment. The present embodiment is different from Embodiment 1 in that the spacer is formed of an insulating layer material.

In the pressing force sensor IPD shown in FIG. 15, the insulating layer ILI is disposed on the transistor Tr, and the insulating layer PLI is disposed on the insulating layer ILI. The signal line S and the individual electrode PE are disposed on the insulating layer PLI. The configuration up to the insulating layer ILI, and the signal line S and the individual electrode PE are equivalent to those of FIG. 4. The insulating layer ILI may not be provided when not necessary.

A spacer HSPC of FIG. 15 is formed of the same material as that of the insulating layer PLI. The spacer HSPC is in contact with the pressure-sensitive layer FSL. The individual electrode PE is formed avoiding the spacer HSPC.

In the present embodiment, similarly to the spacer HSPC, an auxiliary spacer HADS is also formed of the same material as that of the insulating layer PLI. The auxiliary spacer HADS is in contact with an upper surface PLIu of the insulating layer PLI and the pressure-sensitive layer FSL.

When the gap between the insulating layer PLI and the pressure-sensitive layer FSL is assumed to be a distance d, the height of the spacer HSPC and the height of the auxiliary spacer HADS are the distance d. The thickness of the insulating layer PLI is assumed to be a distance t.

Next, a method of forming the auxiliary spacer HADS and the spacer HSPC will be described.

First, the configuration up to the scanning line G (gate electrode) of the transistor Tr is formed on the first base BA1, and the insulating layer ILI is formed covering the scanning line G and the insulating layer GI.

Then, a material layer of the insulating layer PLI is formed with a thickness of a distance (d+t) covering the insulating layer ILI. When it is not necessary to provide the insulating layer ILI as described above, the material layer of the insulating layer PLI is formed with the thickness of the distance (d+t) covering the scanning line G and the insulating layer GI.

After the material layer of the insulating layer PLI is formed, the material layer is etched by photolithography, and the spacer HSPC and the auxiliary spacer HADS are thereby formed. At this time, the thickness of the insulating layer PLI is etched to the distance t.

Then, the signal line S and the individual electrode PE having a through hole PEH are formed.

Here, another method of forming the auxiliary spacer HADS and the spacer HSPC will be described below.

The material layer of the insulating layer PLI is formed with the thickness of the distance t covering the insulating layer ILI. After the material layer is formed, the individual electrode PE and the signal line S are formed on the material layer. At this time, the through hole PEH is formed in the individual electrode PE, and the through hole PEH overlaps an area in which the spacer HSPC is formed.

After that, the material layer of the insulating PLI is formed again with the thickness of the distance d. The material layer is etched by photolithography, and the spacer HSPC and the auxiliary spacer HADS having the height of the distance d are thereby formed.

Similarly to FIGS. 1A and 1B and FIGS. 3A and 3B, the shape of the auxiliary spacer HADS shown in FIG. 13 is a wall shape. Similarly to Embodiment 1, the auxiliary spacer HADS shown in FIG. 15 does not overlap the individual electrode PE. However, the shape and arrangement of the auxiliary spacer HADS are not limited to these. Similarly to FIGS. 9A and 9B, the auxiliary spacers HADS of the present embodiment may be scattered in dots in planar view and surround the individual electrodes PE. Similarly to FIG. 10, one part of the auxiliary spacer HADS of the present embodiment overlaps the individual electrode PE but the other part may not overlap the individual electrode PE. Similarly to FIGS. 11A and 11B, the auxiliary spacer HDA of the present embodiment may cover the individual electrode PE. In the auxiliary spacer HADS of the present embodiment, similarly to FIG. 12, the auxiliary spacer ADS may be smaller than the individual electrode PE. When the auxiliary spacer HADS is smaller than the individual electrode PE, similarly to the spacer HSPC, a through hole may be formed. In the auxiliary spacer HADS of the present embodiment, similarly to FIG. 13, the scattering density of the auxiliary spacer HADS may be non-uniform.

As described above, the auxiliary spacer HADS and the spacer HSPC of the present embodiment can refer to the auxiliary spacer ADS and the spacer SPC of Embodiment 1. Therefore, the auxiliary spacer ADS and the spacer SPC of Embodiment 1 and its configuration examples may be replaced with the auxiliary spacer HADS and the spacer HSPC for the explanations of them, and the details of them will be omitted here.

Also in the present embodiment, similar effects to those of the above-described embodiment can be produced.

Configuration Example 1

Figure 16:
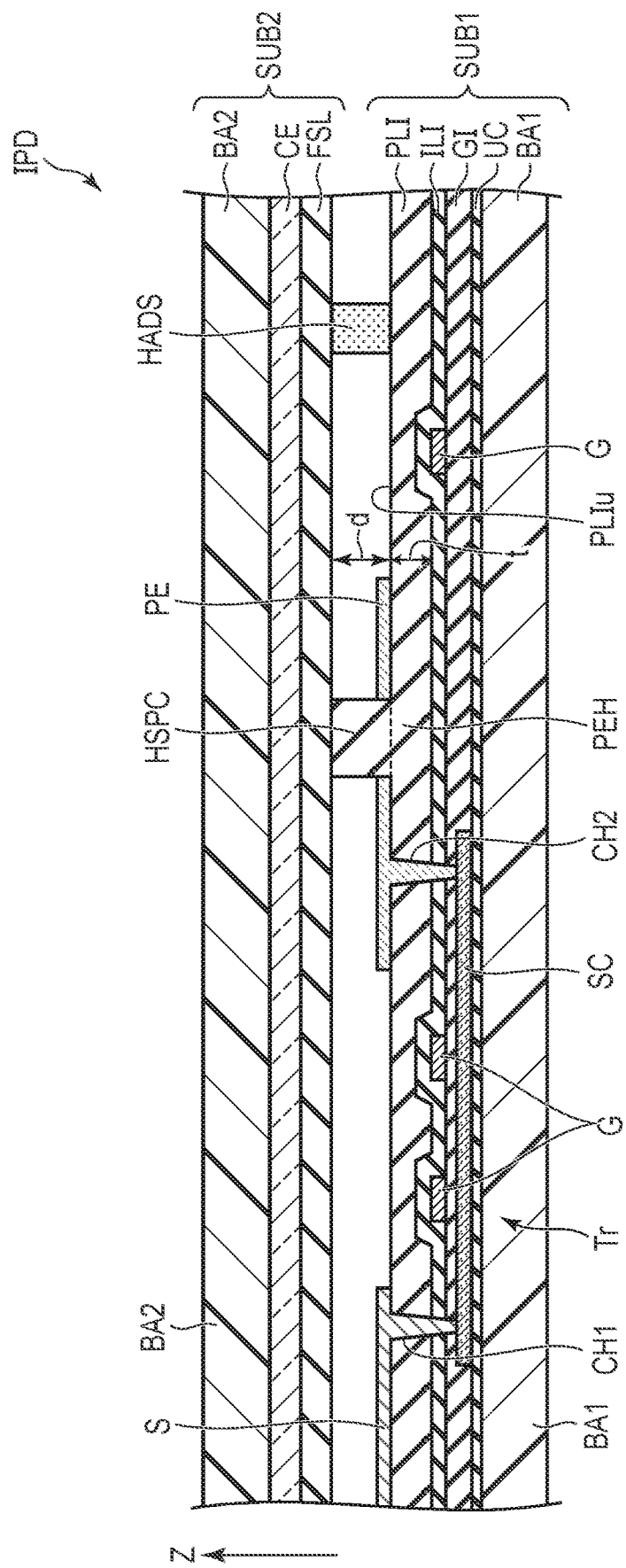
FIG. 16 is a cross-sectional view showing another configuration example of the pressing force sensor in the present embodiment.

FIG. 16 is a cross-sectional view showing another configuration example of the pressing force sensor in the present embodiment. The configuration example shown in FIG. 16 is different from the configuration example shown in FIG. 15 in that the auxiliary spacer HADS is formed not of the insulating layer material but of a material different from that of the spacer HSPC.

The pressing force sensor IPD shown in FIG. 16 includes the auxiliary spacer HADS formed of a material different from that of the spacer HSPC, that is, the insulating layer PLI. As the material of the auxiliary spacer HADS, similarly to the auxiliary spacer ADS of Embodiment 1, an adhesive, for example, an optical clear adhesive (OCA) or an optical clear resin (OCR) which is a UV curable resin may be used.

Also in the present configuration example, similar effects to those of the above-described embodiment can be produced.

Configuration Example 2

FIG. 17 is a cross-sectional view showing another configuration example of the pressing force sensor in the present embodiment. The configuration example shown in FIG. 17 is different from the configuration example shown in FIG. 15 in that the auxiliary spacer is formed of the insulating layer material and a material covering the insulating layer material and different from that of the spacer.

In the pressing force sensor IPD shown in FIG. 17, the auxiliary spacer HADS has a convex portion HADSC and a convex portion HADSE covering the convex portion HADSC. The convex portion HADSC is formed of the same material as that of the insulating layer PLI. The convex portion HADSE is formed of a material different from that of the spacer HSPC, that is, the insulating layer PLI.

A method of forming the auxiliary spacer HADS shown in FIG. 17 will be described. First, the convex portion HADSC is formed similarly to the spacer HSPC. Then, a precursor of the convex portion HADSE is applied covering the convex portion HADSC by a dispenser or the like. Then, the precursor is cured, and the convex portion HADSE is thereby formed. The auxiliary spacer HADS including the convex portion HADSC and the convex portion HADSE may be formed as described above.

As the material of the convex portion HADSE, a similar material to that of the auxiliary spacer ADS of Embodiment 1 may be used.

Also in the present configuration example, similar effects to those of the above-described embodiment can be produced.

Embodiment 3

Figure 18A:
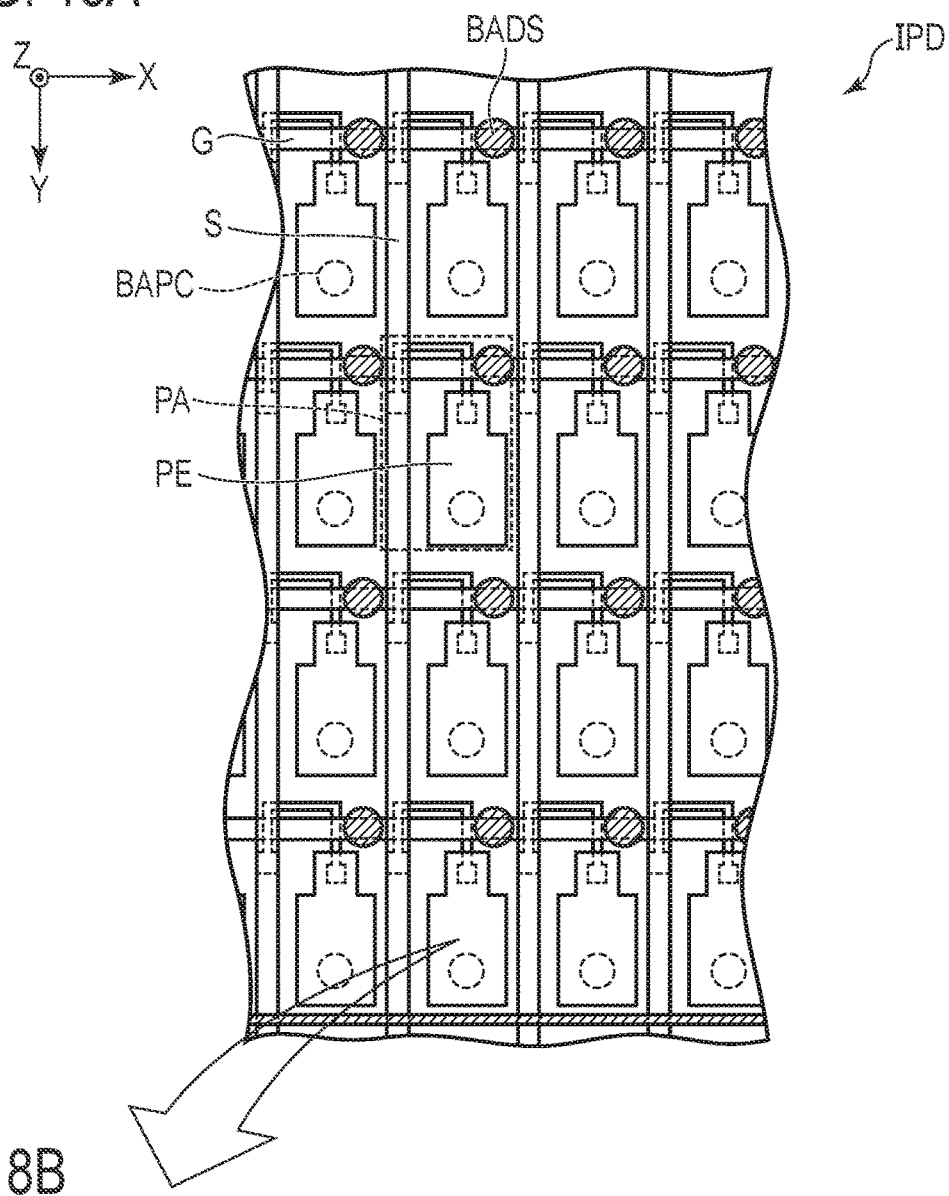
FIG. 18A is a plan view showing a pressing force sensor IPD of Embodiment 3.
Figure 18B:
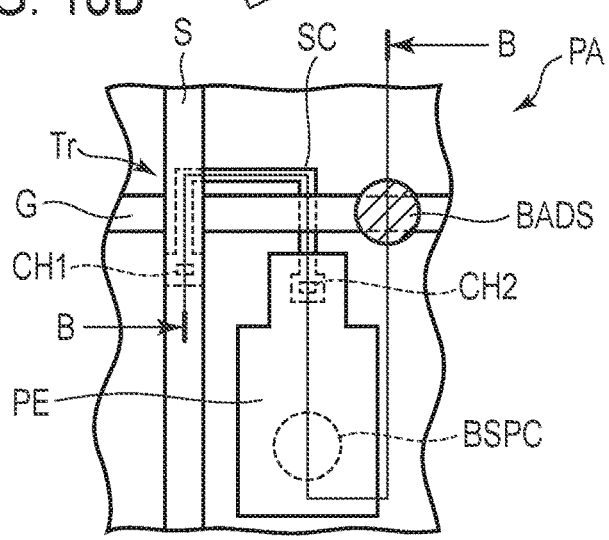
FIG. 18B is an enlarged plan view showing one individual area PA of FIG. 18A.

FIG. 18A is a plan view showing the pressing force sensor IPD of the present embodiment. FIG. 18B is an enlarged plan view showing one individual area PA of FIG. 18A. The present embodiment is different from Embodiment 1 in that the spacer and the auxiliary spacer are formed of a spacer bead coated with a curable resin and a support structure for the spacer and the auxiliary spacer is provided.

The pressing force sensor IPD shown in FIGS. 18A and 18B includes a spacer BSPC disposed inside the individual area PA and arranged overlapping the individual electrode PE. In FIGS. 18A and 18B and the explanations of them, the explanations of portions overlapping FIGS. 3A and 3B and FIGS. 9A and 9B will be referred to, and the details will be omitted.

An auxiliary spacer BADS is disposed in an area not overlapping the individual electrode PE. Both of the spacer BSPC and the auxiliary spacer BADS of the present embodiment may be provided or only one of them may be provided. The embodiment described with reference to FIG. 18 is a case where both of the spacer BSPC and the auxiliary spacer BADS are provided.

Figure 19:
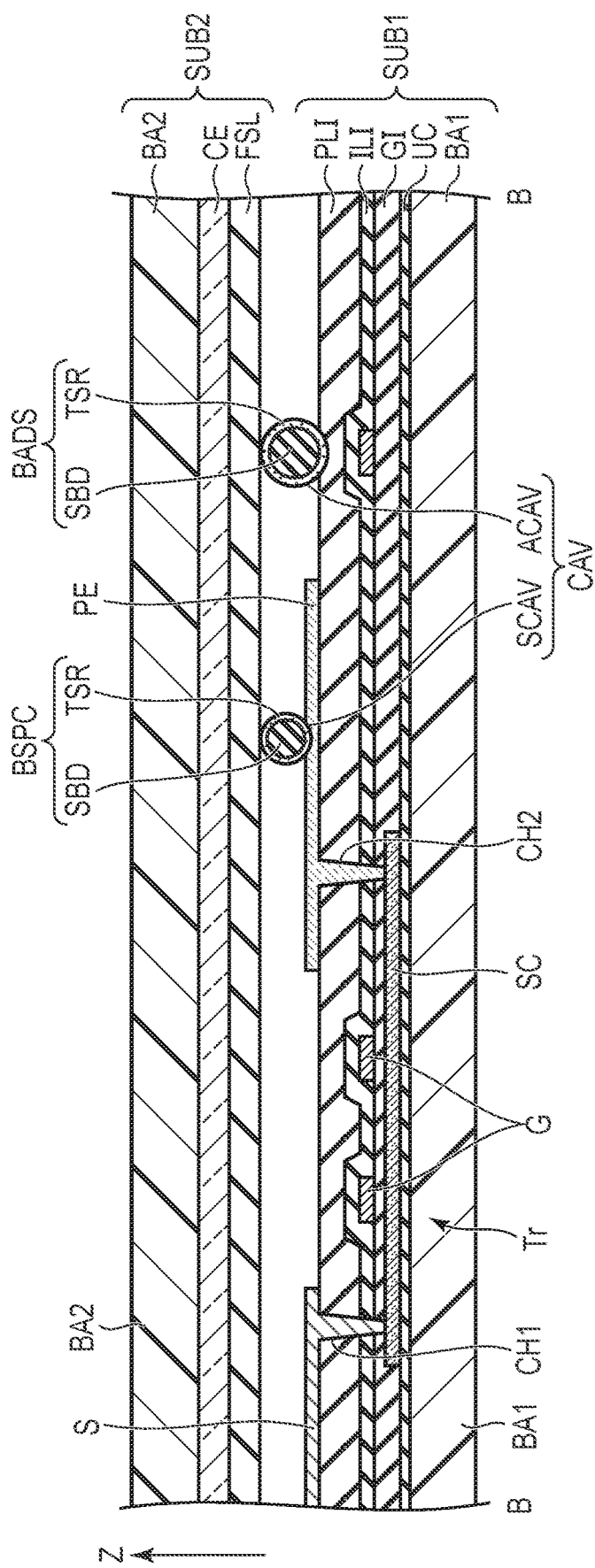
FIG. 19 is a cross-sectional view of the pressing force sensor IPD taken along line B-B of FIG. 18B.

FIG. 19 is a cross-sectional view of the pressing force sensor IPD taken along line B-B of FIG. 18B.

In the pressing force sensor IPD shown in FIG. 19, the first substrate SUB1 includes the transistor Tr, the insulating layer ILI on the transistor Tr, and the insulating layer PLI on the insulating layer ILI. The configuration up to the insulating layer ILI is equivalent to that of FIG. 4. The insulating layer ILI may not be provided when not necessary.

The second substrate SUB2 shown in FIG. 19 includes the second base BA2, the common electrode CE and the pressure-sensitive layer FSL similarly to FIG. 4.

The spacer BSPC is disposed between the individual electrode PE of the first substrate SUB1 and the pressure-sensitive layer FSL of the second substrate SUB2. The auxiliary spacer BADS is disposed between the insulating layer PLI of the first substrate SUB1 and the pressure-sensitive layer FSL of the second substrate SUB2.

The spacer BSPC and the auxiliary spacer BADS are each formed of a spacer bead SBD and a curable resin TSR. The spacer bead SBD is a spherical body formed of a highly-resistive or insulating and hard material such as silica or aluminum oxide.

The curable resin TSR covers the spacer bead SBD and fixes the position of the spacer bead SBD. The curable resin TSR is formed of, for example, thermally curable resin, more specifically, epoxy resin, acrylic resin or the like.

Here, a method of arranging the spacer BSPC and the auxiliary spacer BADS will be described.

First, the spacer bead SBD and the uncured curable resin TSR covering the spacer bead SBD are arranged on the first substrate SUB1. Here, the spacer bead SBD and the uncured curable resin TSR which are to be the spacer BSPC are arranged on the individual electrode PE. The spacer bead SBD and the uncured curable resin TSR which are to be the auxiliary spacer BADS are arranged on the insulating layer PLI.

Then, the second substrate SUB2 is arranged being opposed to the first substrate SUB1. The uncured curable resin TSR is thermally cured, and the spacer BSPC and the auxiliary spacer BADS are fixed to respective positions.

The spacer bead SBD and the uncured curable resin TSR may be disposed in the second substrate SUB2. In that case, after the first substrate SUB1 is arranged being opposed to the second substrate SUB2, the uncured curable resin TSR is cured.

The spacer bead SBD maintains the gap between the first substrate SUB1 and the second substrate SUB2. However, if the spacer bead SBD is provided alone, the position may be moved. If the spacer bead SBD is moved, the pressing force sensor IPD cannot accurately detect a pressing force.

However, by curing the curable resin TSR covering the spacer bead SBD, the position of the entire spacer SPC including the spacer bead SBD can be fixed. Accordingly, the pressing force sensor IPD of the present embodiment can accurately detect a pressing force.

In a case where the curable resin TSR is provided alone as the spacer BSPC and the auxiliary spacer BADS, when a pressing force is applied, the curable resin TSR is crushed. In this pressing force sensor IPD, a pressing force cannot be accurately detected. Therefore, the spacer BSPC and the auxiliary spacer BADS of the present embodiment are useful for the pressing force sensor IPD to accurately detect a pressing force.

The pressing force sensor IPD of the present embodiment includes a support structure for the spacer BSPC and the auxiliary spacer BADS.

As shown in FIG. 19, in the individual electrode PE of the first substrate SUB1, a concave portion SCAV is disposed in an area which is in contact with the spacer BSPC. The concave portion SCAV is formed by, for example, removing a part of the individual electrode PE after forming the individual electrode PE.

In the insulating layer PLI of the first substrate SUB1, a concave portion ACAV is disposed in an area which is in contact with the auxiliary spacer BADS. The concave portion ACAV is formed by, for example, removing a part of the insulating layer PLI after forming the insulating layer PLI. Alternatively, the insulating layer PLI having the concave portion ACAV may be formed when the insulating layer PLI is formed.

In the present embodiment, the concave portion SCAV and the concave portion ACAV will be referred to collectively as a support structure CAV. However, as described above, when only one of the spacer BSPC and the auxiliary spacer BADS is provided, only one of the concave portion SCAV and the concave portion ACAV may be provided. The concave portion SCAV is the support structure CAV when only the concave portion SCAV is provided, and the concave portion ACAV is the support structure CAV when only the concave portion ACAV is provided.

The shape and arrangement of the auxiliary spacer BADS is not limited to the above. Similarly to FIG. 10, one part of the auxiliary spacer BADS of the present embodiment may overlap the individual electrode PE but the other part may not overlap the individual electrode PE. Similarly to FIGS. 11A and 11B, the auxiliary spacer BADS of the present embodiment may cover the individual electrode PE. In the auxiliary spacer BADS of the present embodiment, similarly to FIG. 12, the auxiliary spacer BADS may be smaller than the individual electrode PE.

In the above case, the concave portion ACAV is disposed in an area of the layer configuration of the first substrate SUB1 which is in contact with the auxiliary spacer BADS.

As described above, the auxiliary spacer BADS and the spacer BSPC of the present embodiment can refer to the auxiliary spacer ADS and the spacer SPC of Embodiment 1. Therefore, the auxiliary spacer ADS and the spacer SPC of Embodiment 1 and its configuration examples may be replaced with the auxiliary spacer BADS and the spacer BSPC for the explanations of them, and the details of them will be omitted here.

Also in the present embodiment, similar effects to those of the above-described embodiment can be produced.

Configuration Example 1

FIG. 20 is a plan view showing another configuration example of the pressing force sensor in the present embodiment. The configuration example shown in FIG. 20 is different from the configuration example shown in FIG. 18 in that the scattering density of the spacer is non-uniform.

In the pressing force sensor IPD shown in FIG. 20, a column in which the spacer BSCP is disposed for every individual electrode PE (individual area PA) along the second direction Y and a column in which the spacer BSCP is disposed for every other individual electrode PE (individual area PA) are alternately arranged.

Figure 21A:
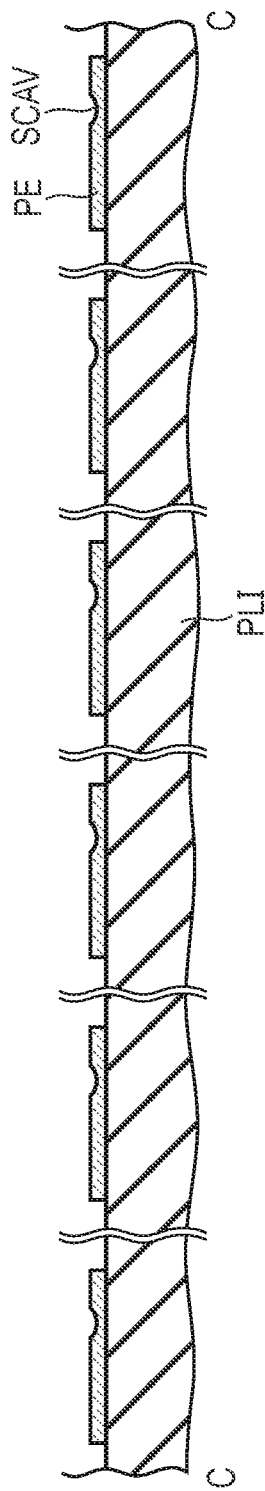
FIG. 21A is a cross-sectional view of the pressing force sensor IPD taken along line C-C of FIG. 20.
Figure 21B:
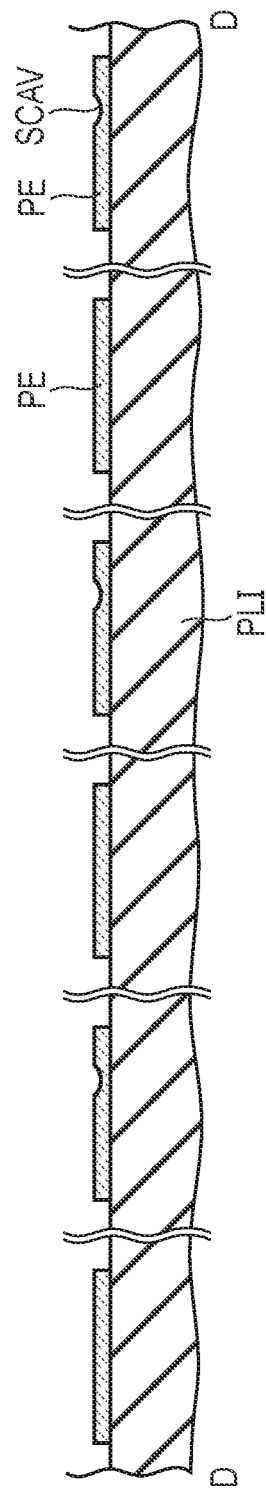
FIG. 21B is a cross-sectional view of the pressing force sensor IPD taken along line D-D of FIG. 20.

FIGS. 21A and 21B are cross-sectional views of the pressing force sensor IPD respectively taken along lines C-C and D-D of FIG. 20. In FIGS. 21A and 21B, in order to make the drawings easy to see, only the individual electrode PE and the insulating layer PLI are illustrated.

In FIG. 21A, the concave portion SCAV is disposed for every individual electrode PE. In FIG. 21B, the concave portion SCAV is disposed for every other individual electrode PE. In either of FIGS. 21A and 21B, the spacer BSPC is arranged being fitted in the concave portion SCAV.

Also in FIGS. 21A and 21B, similarly to FIG. 13, the scattering density of the spacer BSPC is non-uniform. Accordingly, an area for a low pressing force and an area for a high pressing force are formed. Therefore, the dynamic range of the pressing force sensor IPD is increased.

Also in the present configuration example, similar effects to those of the above-described embodiment can be produced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pressing force sensor comprising:
a sensor area;
a plurality of individual electrodes arranged in a matrix in a first direction and a second direction crossing the first direction in the sensor area;
a common electrode opposed to the individual electrodes;
a plurality of first spacers arranged between the individual electrodes and the common electrode and overlapping the individual electrodes; and
a plurality of second spacers disposed in the sensor area and formed of a different material from the first spacers.

2. The pressing force sensor according to claim 1, wherein the material of the second spacers is an adhesive.

3. The pressing force sensor according to claim 1, further comprising a pressure-sensitive layer arranged between the individual electrodes and the common electrode.

4. The pressing force sensor according to claim 1, wherein the second spacers do not overlap the individual electrodes.

5. The pressing force sensor according to claim 1, wherein the second spacers are formed in a wall shape extending in the first direction.

6. The pressing force sensor according to claim 1, wherein the second spacers are disposed surrounding the individual electrodes.

7. The pressing force sensor according to claim 1, wherein a part of the second spacers overlap a part of the individual electrodes.

8. The pressing force sensor according to claim 1, wherein the second spacers overlapping the individual electrodes cover the individual electrodes.

9. The pressing force sensor according to claim 1, wherein the second spacers have a non-uniform scattering density in the sensor area.

10. A pressing force sensor comprising:
a first base;
a transistor disposed on the first base;
an insulating layer disposed on the transistor;
a sensor area disposed on the first base;
a plurality of individual electrodes arranged in a matrix in a first direction and a second direction crossing the first direction in the sensor area;
a common electrode opposed to the individual electrodes;
a plurality of first spacers arranged between the individual electrodes and the common electrode and overlapping the individual electrodes; and
a plurality of second spacers disposed in the sensor area, wherein
the individual areas are each electrically connected to the transistor via the insulating layer, and
the first spacers are formed of a same material as the insulating layer.

11. The pressing force sensor according to claim 10, further comprising a pressure-sensitive layer arranged between the individual electrodes and the common electrode.

12. The pressing force sensor according to claim 10, wherein the second spacers do not overlap the individual electrodes.

13. The pressing force sensor according to claim 10, wherein the second spacers are formed in a wall shape extending in the first direction.

14. The pressing force sensor according to claim 10, wherein the second spacers are disposed surrounding the individual electrodes.

15. The pressing force sensor according to claim 10, wherein a part of the second spacers overlap a part of the individual electrodes.

16. The pressing force sensor according to claim 10, wherein the second spacers overlapping the individual electrodes cover the individual electrodes.

17. The pressing force sensor according to claim 10, wherein the second spacers have a non-uniform scattering density in the sensor area.

18. A pressing force sensor comprising:
a sensor area;
a plurality of individual electrodes arranged in a matrix in a first direction and a second direction crossing the first direction in the sensor area;
a common electrode opposed to the individual electrodes; and
a plurality of first spacers arranged between the individual electrodes and the common electrode and overlapping the individual electrodes, wherein
the first spacers each include a spacer bead and a curable resin covering the spacer bead.

19. The pressing force sensor according to claim 18, further comprising a pressure-sensitive layer arranged between the individual electrodes and the common electrode.

20. The pressing force sensor according to claim 18, wherein
the individual electrodes overlapping the first spacers have a concave portion, and
the first spacers are in contact with the concave portions of the individual electrodes.

* * * * *